United States Patent
Kuwahara

(10) Patent No.: US 11,348,812 B2
(45) Date of Patent: *May 31, 2022

(54) SUBSTRATE TREATING APPARATUS AND SUBSTRATE TRANSPORTING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/931,523

(22) Filed: Jul. 17, 2020

(65) Prior Publication Data

US 2021/0020475 A1    Jan. 21, 2021

(30) Foreign Application Priority Data

Jul. 19, 2019    (JP) .............................. JP2019-133793

(51) Int. Cl.
*H01L 21/67*    (2006.01)
*H01L 21/677*    (2006.01)
(Continued)

(52) U.S. Cl.
CPC ........ *H01L 21/67167* (2013.01); *B65G 47/90* (2013.01); *G03F 7/16* (2013.01);
(Continued)

(58) Field of Classification Search
None
See application file for complete search history.

(56) References Cited

U.S. PATENT DOCUMENTS 5,844,662 A * 12/1998 Akimoto ........... H01L 21/67173
355/27
6,457,199 B1 * 10/2002 Frost ................. H01L 21/67207
15/77
(Continued)

FOREIGN PATENT DOCUMENTS

JP    H09-045613 A    2/1997
JP    2011-187796 A    9/2011
(Continued)

OTHER PUBLICATIONS

Notice of Allowance dated Nov. 11, 2021 for corresponding Korean Patent Application No. 10-2020-0088169.
(Continued)

*Primary Examiner* — Ronald P Jarrett
(74) *Attorney, Agent, or Firm* — Ostrolenk Faber LLP

(57) ABSTRACT

Disclosed are a substrate treating apparatus and a substrate transporting method for the substrate treating apparatus. Two treating blocks are arranged so as not to be stacked, and a first treating block, an ID block, and a second treating block are linearly connected horizontally. Accordingly, the number of treatment layers is increasable while a height of the substrate treating apparatus is suppressed. The first and second treating blocks are each connected to the ID block directly. This enables suppression in step of passing a substrate through a treating block without performing any treatment on the substrate, leading to prevention of decrease in throughput. In addition, a substrate buffer is placed in the middle of the two treating blocks. The two treating blocks enable transportation of substrates W with the substrate buffer. Thus, reduction in footprint of the substrate treating apparatus is obtainable.

11 Claims, 22 Drawing Sheets

(51) Int. Cl.
  *B65G 47/90*   (2006.01)
  *G03F 7/20*    (2006.01)
  *G03F 7/16*    (2006.01)
(52) U.S. Cl.
  CPC ...... *G03F 7/70716* (2013.01); *G03F 7/70733* (2013.01); *H01L 21/67178* (2013.01); *H01L 21/67742* (2013.01); *H01L 21/67775* (2013.01); *H01L 21/67778* (2013.01)

(56) References Cited

U.S. PATENT DOCUMENTS

| | | | |
|---|---|---|---|
| 2009/0000543 A1 | 1/2009 | Fukutomi et al. | 118/58 |
| 2011/0222994 A1 | 9/2011 | Inagaki et al. | 414/222.07 |
| 2014/0022521 A1 | 1/2014 | Harumoto et al. | 355/27 |
| 2015/0279713 A1* | 10/2015 | Kokabu | H01L 21/67276 414/222.12 |
| 2017/0133255 A1* | 5/2017 | Aguilar | H01L 21/67769 |

FOREIGN PATENT DOCUMENTS

| | | |
|---|---|---|
| JP | 2013-222949 A | 10/2013 |
| JP | 2014-022570 A | 2/2014 |
| JP | 2016-201526 A | 12/2016 |
| KR | 10-0819176 B1 | 3/2008 |
| KR | 10-0914399 B1 | 8/2009 |
| KR | 10-2010-0023259 A | 3/2010 |
| KR | 10-1768519 B1 | 8/2017 |
| TW | 201250913 A1 | 12/2012 |

OTHER PUBLICATIONS

Office Action dated Jan. 13, 2022 for corresponding Taiwan Patent Application No. 109124227.

* cited by examiner

A-A VIEW

SUBSTRATE TREATING APPARATUS AND SUBSTRATE TRANSPORTING METHOD

CROSS-REFERENCE TO RELATED APPLICATIONS

This application claims priority to Japanese Patent Application No. 2019-133793 filed Jul. 19, 2019, the subject matter of which is incorporated herein by reference in entirety.

TECHNICAL FIELD

The present invention relates to a substrate treating apparatus for treating substrates and a substrate transporting method for the substrate treating apparatus. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

BACKGROUND ART

As shown in FIG. 1, a currently-used substrate treating apparatus 201 includes an indexer block (hereinafter, appropriately referred to as "ID block") 202 and a treating block 203. See, for example, Japanese Unexamined Patent Application Publication No. 2014-022570A. The ID block 202 includes a carrier platform 216 for placing a carrier C capable of accommodating a plurality of substrates, and a substrate transporting robot (not shown) for transporting a substrate between the carrier C placed on the carrier platform 216 and the treating block 203. The treating block 203 performs a coating treatment for applying a resist liquid to the substrate, for example.

Moreover, the substrate treating apparatus 201 includes a stocker device (carrier buffer device) 208. See for example, Japanese Unexamined Patent Application Publication No. 2011-187796A. The stocker device 208 is disposed so as to extend horizontally toward the carrier platform 216. The stocker device 208 includes a carrier transport mechanism 261 for transporting the carrier C, and a storage shelf 263 for storing the carrier C.

Japanese Unexamined Patent Application Publication No. 2016-201526A discloses a substrate treating system including a delivery block disposed between the ID block and the treating block. The delivery block includes a plurality of buffer units arranged in the vertical direction, and two transfer mechanisms arranged so as to sandwich the plurality of buffer units. The two transfer devices are arranged in a horizontal direction (Y direction) perpendicular with respect to a direction (X direction) in which the ID block and the treating block are arranged.

Moreover, Japanese Unexamined Patent Application Publication No. H09-045613A discloses a substrate treating apparatus in which a coating-treatment block, a cassette station (corresponding to an ID block), and a developing-treatment block are linearly connected in a horizontal direction in this order. The cassette station is configured so that four cassettes containing either an untreated substrate or a treated substrate can be arranged therein. In addition, a first mounting platform for alignment of the substrate is provided at a boundary between the coating-treatment block and the cassette station, and a second mounting platform for alignment of the substrate is provided at a boundary between the cassette station and the developing-treatment block. One transport mechanism in the cassette station transports the substrates through the mounting platforms to the coating-treatment block and the developing-treatment block.

SUMMARY OF THE INVENTION

Technical Problem

The treating block 203 of the substrate treating apparatus 201 includes a plurality of the treatment layers (e.g., the two treatment layers 203A, 203B of FIG. 1) stacked one above the other. This enables parallel treatment of substrates in accordance with the number of the treatment layers. However, the height of the substrate treating apparatus 201 is limited, and the number of the treatment layers to be stacked is also limited.

Thus, the substrate treating apparatus 201 shown in FIG. 2 is applicable, for example. The substrate treating apparatus 201 shown in FIG. 2 includes two treating blocks 203, 205 in a horizontal direction. The treating block 203 includes two treatment layers 203A, 203B. The treating block 205 includes two treatment layer 205A, 205B.

Such a configuration possesses the following problems. For example, when a substrate is transported from the ID block 202 to the treatment layer 205A, the substrate needs to be passed through the treatment layer 203A. Moreover, when a substrate treated in the treatment layer 205A is returned to the ID block 202, the substrate needs to be passed through the treatment layer 203A. Thus, the substrate transportation between the ID block 202 and the treatment layer 205A may cause reduction in throughput of the treatment layer 203A. In addition, reduction in entire throughput of the substrate treating apparatus 201 may be generated. Moreover, the substrate treating apparatus 201 shown in FIG. 2 may have difficulty in control. In addition, reduction in footprint of the substrate treating apparatus 1 is needed.

The present invention has been made regarding the state of the art noted above, and its object is to provide a substrate treating apparatus and a substrate transporting method capable of preventing reduction in throughput, increasing the number of treatment layers, and further reduction in footprint.

Solution to Problem

To achieve the object, the present invention provides a configuration as follows. One aspect of the present invention provides a substrate treating apparatus including an indexer block where a carrier platform for placing a carrier capable of accommodating substrates is provided, a first treating block, and a second treating block. The first treating block, the indexer block, and the second treating block are linearly connected in this order in a horizontal direction. The indexer block includes a substrate buffer disposed in the middle of the first treating block and the second treating block and configured to place a plurality of substrates. The indexer block takes a substrate from a carrier placed on the carrier platform, and transports the substrate to the substrate buffer. The first treating block receives the substrate from the substrate buffer, performs a first treatment on the received substrate, and transports the substrate, subjected to the first treatment, to the substrate buffer. The second treating block receives the substrate from the substrate buffer, performs a second treatment on the received substrate, and transports the substrate, subjected to the second treatment, to the substrate buffer. The indexer block returns the substrate, transported from at least either the first treating block or the second treating block, from the substrate buffer to the carrier placed on the carrier platform.

With the substrate treating apparatus according to the present invention, the first treating block and the second treating block are not arranged so as to stack, but are arranged horizontally. Accordingly, the number of the treatment layers is increasable while the height of the substrate treating apparatus is suppressed. Moreover, when the indexer block, the first treating block, and second treating block are arranged in this order, for example, the operation of passing through the first treating block without performing any treatment on the substrate is required in order to perform a treatment on the substrate in the second treating block. In this regard, the first treating block and the second treating block are each connected directly to the indexer block. This enables suppression in step of passing a substrate through a treating block without performing any treatment on the substrate, leading to prevention of decrease in throughput.

Moreover, it is assumed that a first substrate buffer is provided between the indexer block and the first treating block, and a second substrate buffer is provided between the indexer block and the second treating block. In this case, two substrate buffers are arranged on both sides of the indexer block, and also in the direction where the two treating blocks are arranged. Accordingly, the substrate treating apparatus 1 may be elongated in that direction. According to the present invention, the substrate buffer is disposed in the middle of the two treating blocks. Both of the two treating blocks transport substrates to the substrate buffer. That is, the first substrate buffer and the second substrate buffer are stacked at the same position in plan view (i.e., at one position). Therefore, the possibility of elongating the substrate treating apparatus 1 is reducible. In other words, reduction in footprint of the substrate treating apparatus is obtainable.

Moreover, it is preferred in the substrate treating apparatus described above that the carrier platform is disposed on an upper surface of or above at least one of the indexer block, the first treating block and the second treating block. For instance, if a carrier platform is disposed on the side of the indexer block, the footprint of the substrate treating apparatus increases because the carrier platform is disposed. In this regard, with the configuration of the present invention, the carrier platform overlaps with at least one of the indexer block, the first treating block and the second treating block in plan view. As a result, suppressed increase in footprint of the substrate treating apparatus is obtainable.

Moreover, the following is preferred in the substrate treating apparatus described above. The substrate treating apparatus further includes a carrier storage shelf and a carrier transport mechanism. The carrier storage shelf is mounted on at least one of the indexer block, the first treating block, and the second treating block, and is configured to store the carrier. The carrier transport mechanism is mounted on at least one of the indexer block, the first treating block, and the second treating block, and is configured to transport the carrier between the carrier platform and the carrier storage shelf.

If the carrier storage shelf and the carrier transport mechanism are provided horizontally with respect to the indexer block and two treating blocks, the footprint of the substrate treating apparatus increases accordingly. In this regard, the carrier storage shelf and the carrier transport mechanism are arranged so as to overlap at least one of the indexer block and the two treating blocks in plan view. As a result, suppressed increase in footprint of the substrate treating apparatus is obtainable. This allows the substrate treating apparatus to fit in a limited footprint.

Moreover, it is preferred that the substrate treating apparatus described above further includes a carrier storage shelf configured to store the carrier, and a carrier transport mechanism configured to transport the carrier between the carrier platform and the carrier storage shelf. The carrier storage shelf and the carrier transport mechanism are mounted on one lower block of the first treating block and the second treating block.

If the carrier storage shelf and the carrier transport mechanism are provided horizontally with respect to the indexer block and two treating blocks, the footprint of the substrate treating apparatus increases accordingly. In this regard, the carrier storage shelf and the carrier transport mechanism are arranged so as to overlap one of the two treating blocks in plan view. As a result, suppressed increase in footprint of the substrate treating apparatus is obtainable. Moreover, the carrier storage shelf and the carrier transport mechanism are mounted on the lower block of the first treating block and the second treating block. Therefore, the height of the substrate treating apparatus is suppressible.

Moreover, it is preferred in the substrate treating apparatus described above that the second treating block performs a treatment equal to a treatment by the first treating block. This yields increase in number of substrates subjected to parallel treatment.

Moreover, it is preferred in the substrate treating apparatus described above that the indexer block further includes an indexer substrate transport mechanism therein, and the indexer substrate transport mechanism transports a substrate between a carrier placed on the carrier platform and the substrate buffer. This enables the indexer substrate transport mechanism to transport substrate between a carrier placed on the carrier platform and the substrate buffer. In addition, both the first treating block and the second treating block are capable of taking substrates placed on the substrate buffer by the indexer substrate transport mechanism.

Moreover, it is preferred in the substrate treating apparatus described above that the indexer block includes another indexer substrate transport mechanism therein in addition to the indexer substrate transport mechanism, and the two indexer substrate transport mechanisms are arranged across the substrate buffer perpendicularly with respect to a direction in which the first treating block and the second treating block are arranged. That is, the two treating blocks are arranged so as to sandwich the substrate buffer. Moreover, the two indexer substrate transport mechanisms are arranged so as to sandwich the substrate buffer perpendicularly with respect to a direction in which the two treating blocks are arranged. This enables taking of the substrates from four directions horizontally with respect to the substrate buffer.

Moreover, it is preferred in the substrate treating apparatus described above that the first treating block includes a first transport mechanism, the second treating block includes a second transport mechanism, the first treating block receives a substrate from the substrate buffer via the first transport mechanism, performs a first treatment on the received substrate, and transports the substrate, subjected to the first treatment, to the substrate buffer via the first transport mechanism, and the second treating block receives the substrate from the substrate buffer via the second transport mechanism, performs a second treatment on the received substrate, and transports the substrate, subjected to the second treatment, to the substrate buffer via the second transport mechanism.

This allows performance of the first treatment and the second treatment on the substrate. The substrates are transportable from the first treating block to the second treating block through the substrate buffer without using the substrate transportation by the indexer block. Accordingly, the burden of the substrate transportation by the indexer block is reducible. Therefore, the substrate transportation is performable efficiently, leading to prevention of reduction in throughput.

Moreover, it is preferred in the substrate treating apparatus described above that at least either the first treating block or the second treating block includes a plurality of treatment layers arranged to be stacked, the substrate buffer includes a plurality of buffer units provided respectively corresponding to levels of the treatment layers, and each of the buffer units is configured to be detachable and attachable from and to the indexer block. The substrate buffer is provided with a plurality of buffer units. The buffer units are individually configured to be detachable and attachable. Therefore, since the buffer units are individually transportable, the substrate buffer is easily transportable.

Moreover, the following is preferred in the substrate treating apparatus described above. The substrate buffer includes a plurality of substrate platforms arranged vertically. Each of the substrate platforms includes three support pins disposed about a vertical axis and configured to support one substrate. The three support pins are configured to be detachable and attachable from and to each of the substrate platforms. The three support pins of each of the substrate platforms are arranged so as not to overlap the three support pins of the substrate platforms immediately above and below in plan view.

If the two support pins overlap in plan view, the tool may touch the lower support pin in attaching and detaching the upper support pin. In contrast to this, if the two support pins do not overlap in plan view, the possibility that the tool will touch the lower support pin is reduced in attaching and detaching the upper support pin. Accordingly, this makes it easy to attach and detach the support pins. Therefore, enhanced maintainability of the buffer units is obtainable.

Another aspect of the present invention provides a substrate transporting method for a substrate treating apparatus. The substrate treating apparatus includes an indexer block where a carrier platform for placing a carrier capable of accommodating substrates is provided, a first treating block, and a second treating block. The substrate transporting method includes a first taking and transporting step of causing the indexer block to take a substrate from a carrier placed on the carrier platform and to transport the substrate to a substrate buffer provided inside the indexer block, a first treating and transporting step of causing the first treating block to receive the substrate from the substrate buffer, to perform a first treatment on the received substrate, and to transport the substrate, subjected to the first treatment, to the substrate buffer, a second treating and transporting step of causing the second treating block to receive the substrate from the substrate buffer, to perform a second treatment on the received substrate, and to transport the substrate, subjected to the second treatment, to the substrate buffer, and a returning step of causing the indexer block to return the substrate, transported from at least either the first treating block or the second treating block, from the substrate buffer to the carrier placed on the carrier platform. The first treating block, the indexer block, and the second treating block are linearly connected in this order in a horizontal direction, and the substrate buffer is disposed in the middle of the first treating block and the second treating block, and places a plurality of substrates therein.

With the substrate transporting method of the substrate treating apparatus according to the present invention, the first treating block and the second treating block are not arranged so as to stack, but are arranged horizontally. Accordingly, the number of the treatment layers is increasable while the height of the substrate treating apparatus is suppressed. Moreover, when the indexer block, the first treating block, and second treating block are arranged in this order, for example, the operation of passing through the first treating block without performing any treatment on the substrate is required in order to perform a treatment on the substrate in the second treating block. In this regard, the first treating block and the second treating block are each connected directly to the indexer block. This enables suppression in step of passing a substrate through a treating block without performing any treatment on the substrate, leading to prevention of decrease in throughput.

Moreover, it is assumed that a first substrate buffer is provided between the indexer block and the first treating block, and a second substrate buffer is provided between the indexer block and the second treating block. In this case, two substrate buffers are arranged on both sides of the indexer block, and also in the direction where the two treating blocks are arranged. Accordingly, the substrate treating apparatus 1 may be elongated in that direction. According to the present invention, the substrate buffer is disposed in the middle of the two treating blocks. The two treating blocks each transport substrates to the substrate buffer. That is, the first substrate buffer and the second substrate buffer are stacked at the same position in plan view (i.e., at one position). Therefore, the possibility of elongating the substrate treating apparatus 1 is reducible. In other words, reduction in footprint of the substrate treating apparatus is obtainable.

Advantageous Effects of Invention

The substrate treating apparatus and the substrate transporting method according to the present invention are capable of preventing a decrease in throughput, increasing the number of the treatment layers, and further reducing the footprint.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 3:
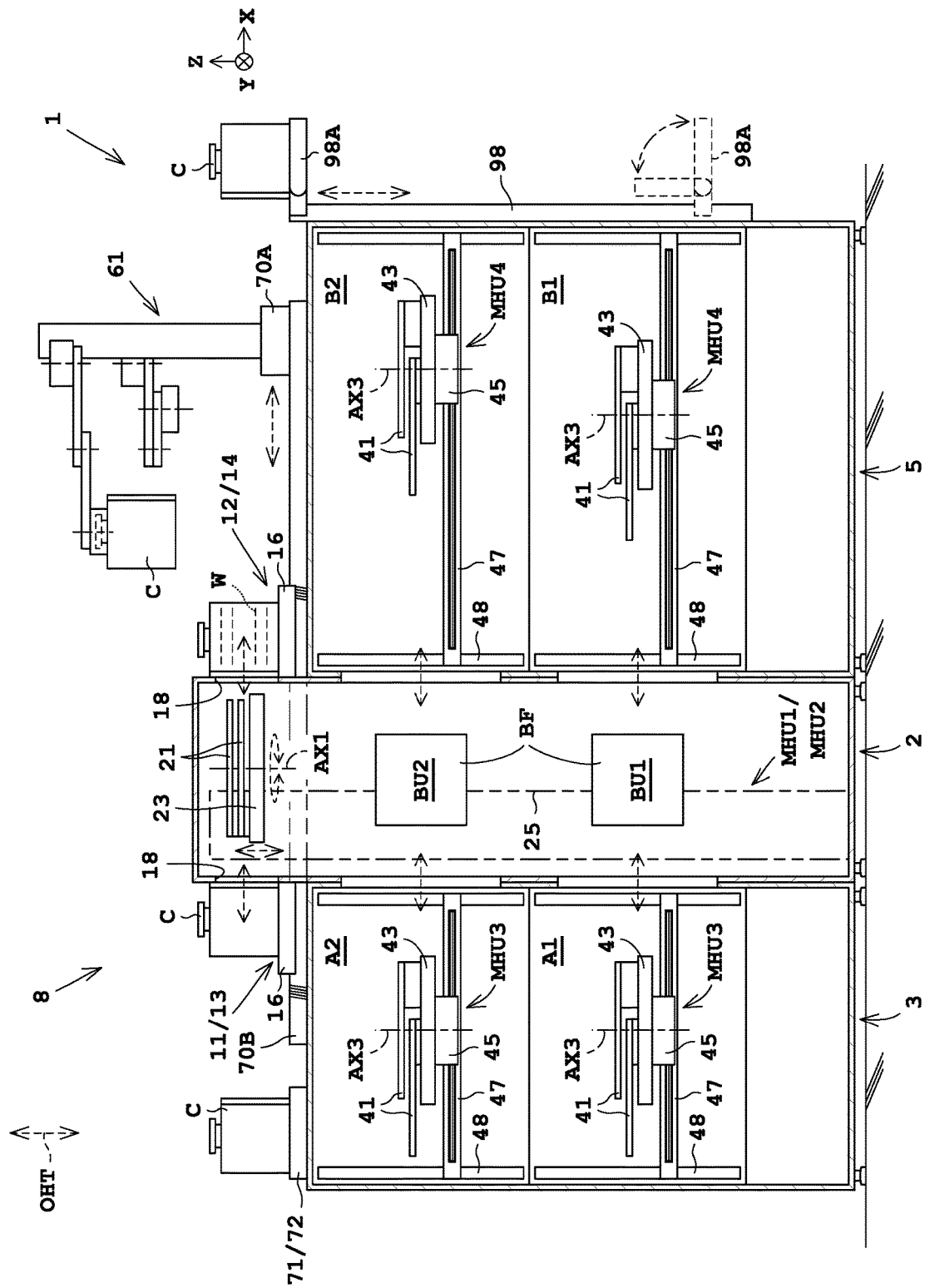
FIG. 3 is a longitudinal cross-sectional view of a substrate treating apparatus according to a first embodiment.
Figure 4:
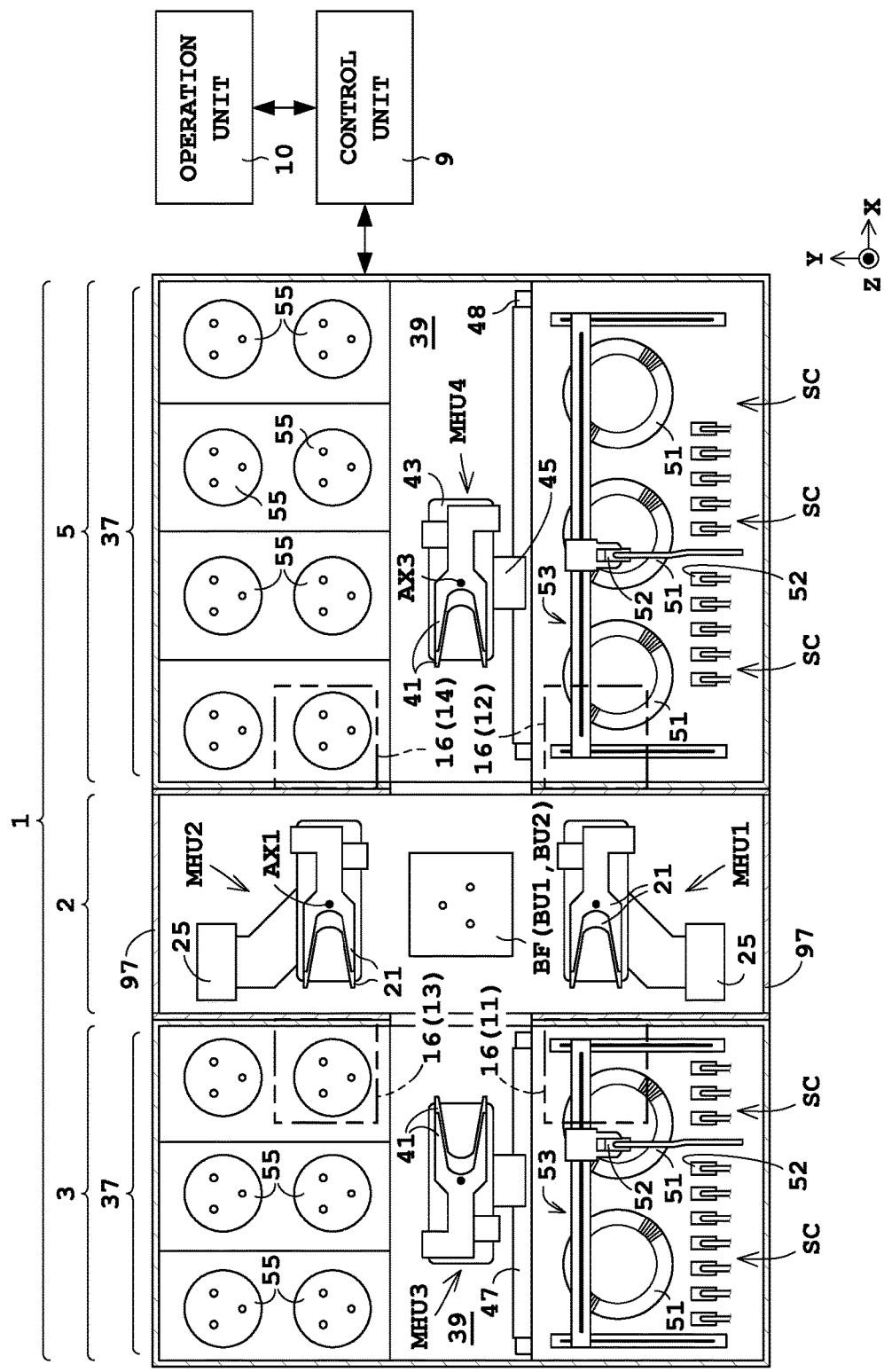
FIG. 4 is a horizontal cross-sectional view of the substrate treating apparatus according to the first embodiment.
Figure 5:
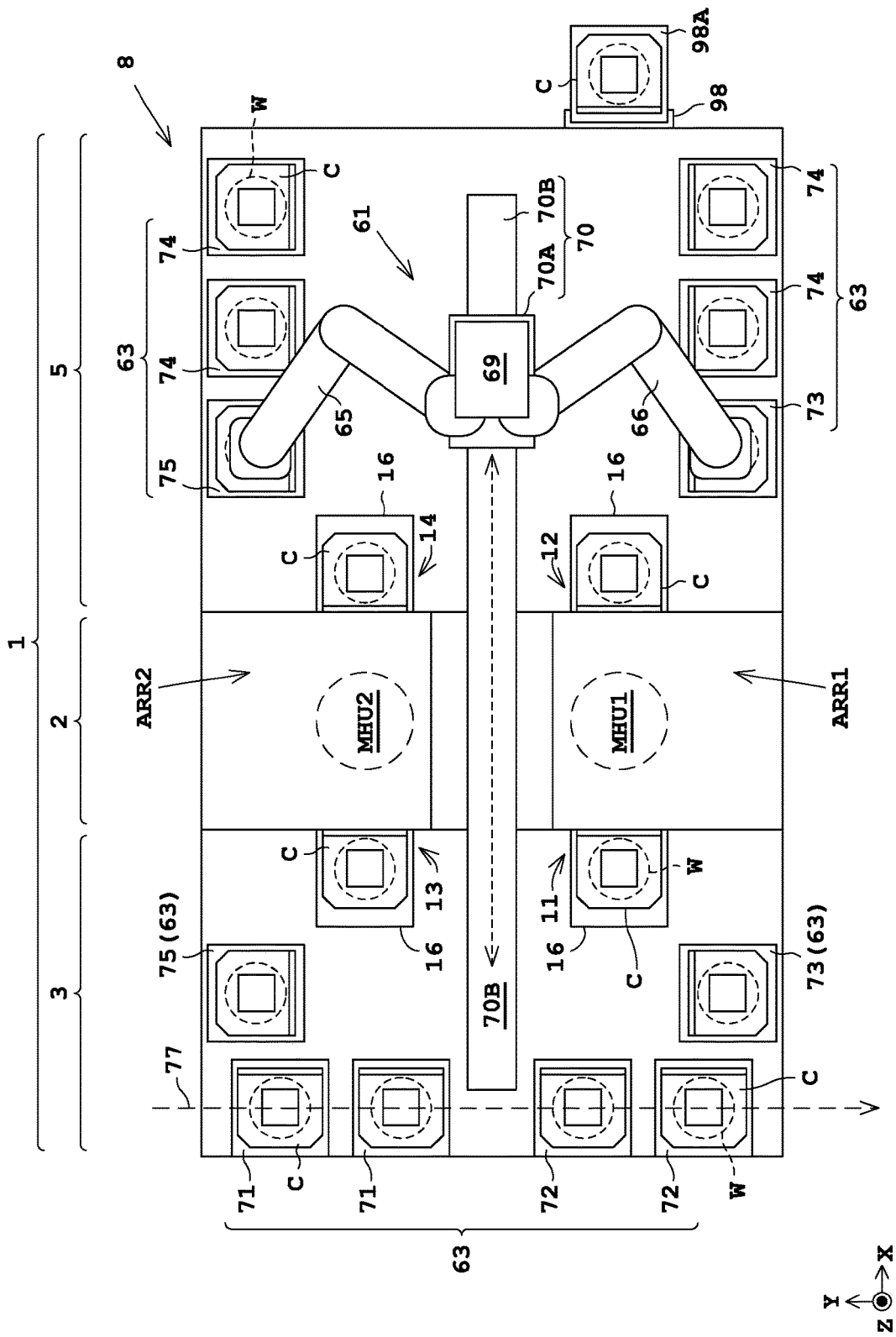
FIG. 5 is a plan view of the substrate treating apparatus according to the first embodiment.

A first embodiment of the present invention will now be described with reference to the drawings. FIG. 3 is a longitudinal cross-sectional view of a substrate treating apparatus according to a first embodiment. FIG. 4 is a horizontal cross-sectional view of the substrate treating apparatus according to the first embodiment. FIG. 5 is a plan view of the substrate treating apparatus according to the first embodiment.

(1) Configuration of Substrate Treating Apparatus 1

Reference is made to FIGS. 3 and 4. The substrate treating apparatus 1 includes an ID block (indexer block) 2, a first treating block 3, a second treating block 5, and a carrier buffer device 8. The first treating block 3, ID block 2, and the second treating block 5 are linearly connected in a horizontal direction in this order. Specifically, the first treating block 3 is connected to the ID block 2 in the horizontal direction (X direction) with respect to the ID block 2. The second treating block 5 is disposed on the opposite side of the first treating block 3 across the ID block 2. The second treating block 5 is connected to the ID block 2.

Moreover, as shown in FIG. 4, the substrate treating apparatus 1 includes a control unit 9 and an operation unit 10. The control unit 9 includes, for example, a central processing unit (CPU). The control unit 9 controls components of the substrate treating apparatus 1. The operation unit 10 includes a display unit (e.g., a liquid crystal monitor), a memory unit, and an input unit. The memory unit includes, for example, at least one of a read-only memory (ROM), random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1.

(1-1) Configuration of ID Block 2

The ID block 2 includes four openers (carrier platforms) 11 to 14, two substrate transport mechanisms (robots) MHU1, MHU2, and a single substrate buffer BF, as shown in FIGS. 4 and 5. The two substrate transport mechanisms MHU1, MHU2, and the substrate buffer BF are disposed inside the ID block 2. Each of the two substrate transport mechanisms MHU1, MHU2 corresponds to the indexer substrate transport mechanism of the present invention.

(1-1-1) Configuration of Openers 11 to 14, Etc.

The four openers 11 to 14 are provided on an outer wall of the ID block 2. The two openers 11 and 12 are arranged around the first substrate transport mechanism MHU1 so that the first substrate transport mechanism MHU1 can put a substrate W into and out of a carrier C. In FIGS. 3 and 4, the two openers 11, 12 are arranged in a forward/rearward direction (X direction) across the substrate transport mechanism MHU1. Similarly to the two openers 11, 12, the two openers 13, 14 are disposed around the second substrate transport mechanism MHU2 so that the second substrate transport mechanism MHU2 can load and unload the substrate W into and from the carrier C. The two openers 13, 14 are arranged in the forward/rearward direction across the second substrate transport mechanism MHU2.

Figure 2:
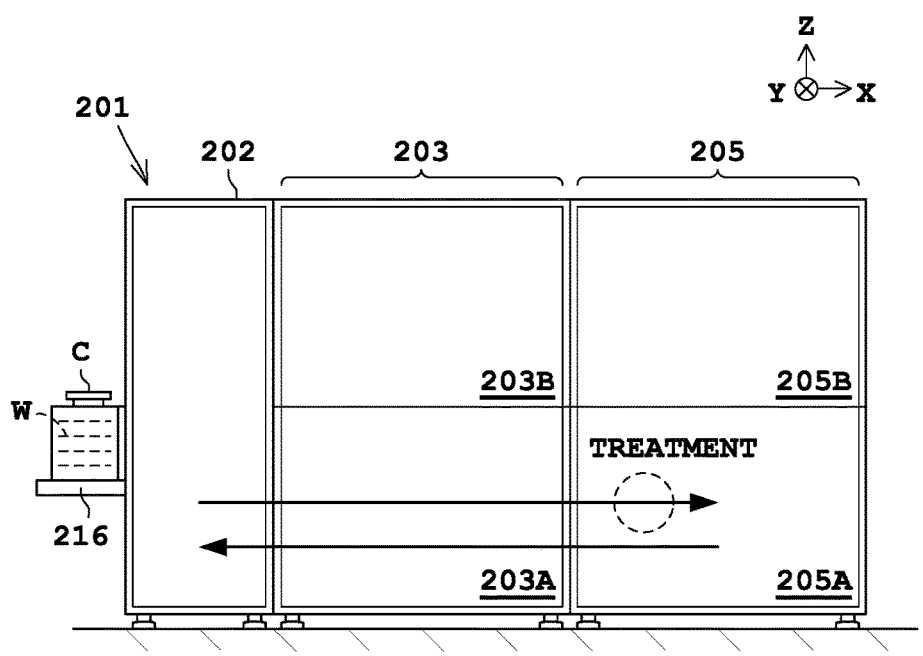
FIG. 2 illustrates a problem to be solved of the present invention.

Each of the four openers 11 to 14 includes a platform 16, an opening 18, a shutter member (not shown), and a shutter member driving mechanism (not shown), as shown in FIG. 2. The platform 16 is used to place the carrier C thereon.

The carrier C enables accommodation of a plurality of (e.g., 25) substrates W in a horizontal orientation. In the carrier C, a plurality of substrates W are arranged in a vertical direction (Z direction). A gap is provided between two adjacent substrates W. For instance, a FOUP (Front Open Unified Pod) is used as the carrier C. Alternatively, a container except the FOUP (e.g., a Standard Mechanical Inter Face (SMIF) pod) is usable. The carrier C includes, for example, a carrier body with which an opening for taking in and out the substrate W is provided, and a lid for closing the opening. The substrates W are housed in the carrier body. The platform 16 corresponds to a carrier platform of the present invention.

The opening 18 is used to pass the substrate W. The shutter member is configured to open and close the opening 18 and to attach and detach the lid to and from the carrier body of the carrier C. The shutter member driving mechanism includes an electric motor to drive the shutter member. After removing the lid from the carrier body, the shutter member is moved horizontally (Y direction) or downward (Z direction) along the opening 18, for example.

Figure 1:
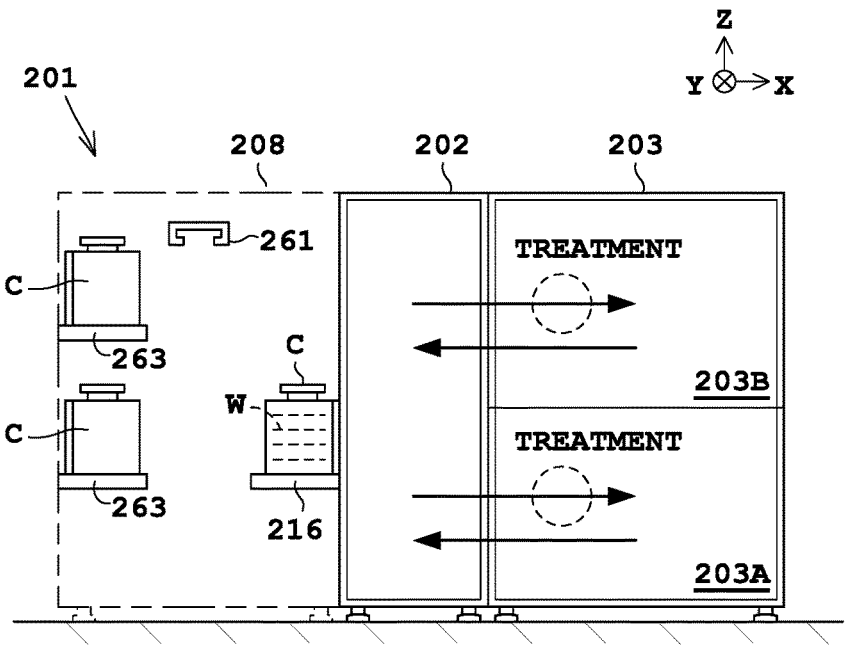
FIG. 1 illustrates a currently-used substrate treating apparatus.

The platform 16 is disposed above the first treating block 3 and the second treating block 5. Specifically, the platforms 16 of the two openers 11, 13 are disposed above the first treating block 3. Also, the platforms 16 of the two openers 12, 14 are disposed above the second treating block 5. Here, the platforms 16 of the two openers 11, 13 may be provided on an upper surface or a roof of the first treating block 3. Further, the platforms 16 of the two openers 12, 14 may be provided on an upper surface or a roof of the second treating block 5. As shown in FIG. 1, for example, if the platform 216 (opener) is placed on the side of the ID block 202, the footprint of the substrate treating apparatus 201 is increased according to an area of the platform 216. In this regard, the platforms 16 overlaps at least one of the ID block 2 and the two treating blocks 3, 5 in plan view. As a result, suppressed increase in footprint of the substrate treating apparatus 1 is obtainable.

(1-1-2) Configuration of Substrate Transport Mechanisms MHU1, MHU2

As shown in FIG. 4, the two substrate transport mechanisms MHU1, MHU2 are arranged across the substrate buffer BF in a perpendicular direction (Y direction) with respect to a forward/rearward direction (X direction) in which the first treating block 3 and the second treating block 5 are arranged. The two substrate transport mechanisms MHU1, MHU2 each transport the substrate W into and out of the substrate buffers BF. Further, the first substrate transport mechanism MHU1 transports a substrate W between the carrier C placed on the platforms 16 of the two openers 11, 12, and the substrate buffer BF. The second substrate transport mechanism MHU2 transports a substrate W between the carriers C placed on the platforms 16 of the two openers 13, 14, and the substrate buffer BF.

Figure 6:
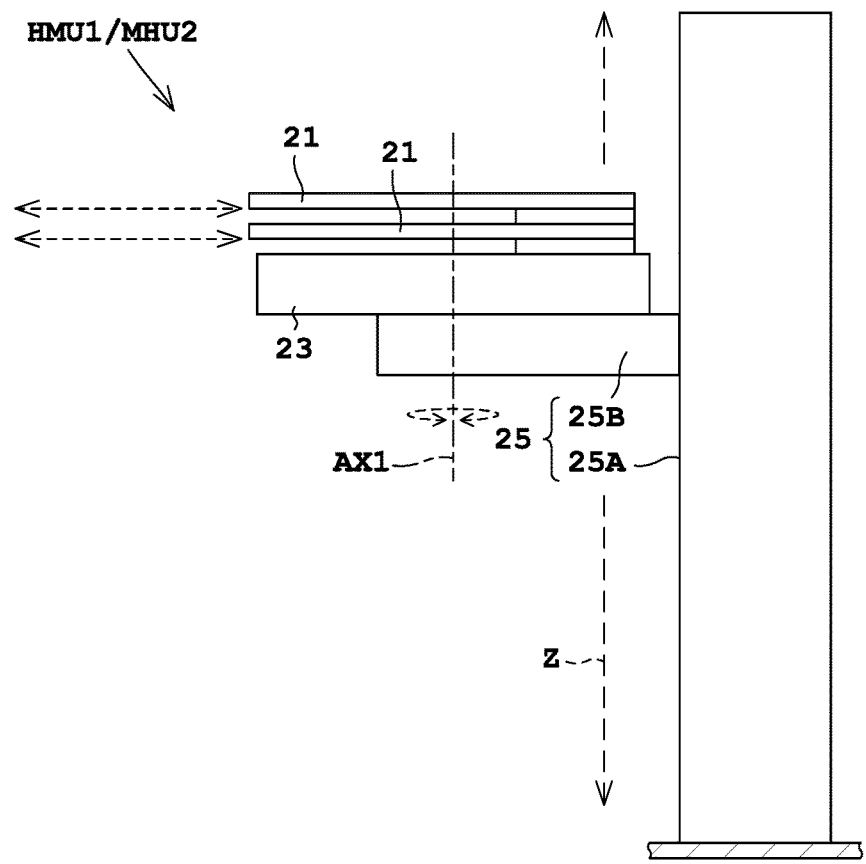
FIG. 6 illustrates a substrate transport mechanism of the indexer block.
Figure 7:
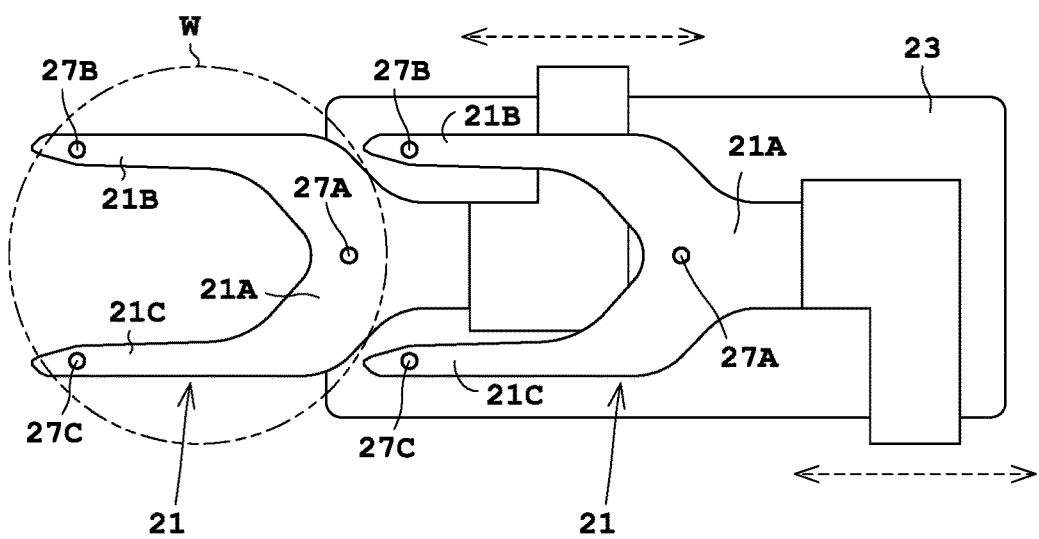
FIG. 7 is a plan view of two hands and a forward/rearward driving unit.

Reference is made to FIGS. 6 and 7. The two substrate transport mechanisms MHU1, MHU2 each includes two hands 21, a forward/rearward driving unit 23, and a lifting/lowering rotation driving unit 25. The two hands 21 each hold a substrate W. The two hands 21 are movable forward and backward in the horizontal direction individually. Therefore, this achieves taking of one substrate W from the carrier C, or taking of two substrates W at the same time.

As shown in FIG. 7, the hand 21 includes one basic part 21A, and two tip parts 21B, 21C branched from the basic part 21A. The hand 21 is formed in a Y-shape, a U-shape, or a two-pronged fork shape. Three suction portions 27A to 27C for holding a substrate W by sucking the substrate W are provided on the basic part 21A and the two tip parts 21B, 21C, respectively. Each of the three suction portions 27A to 27C is configured such that a suction force is applicable by a pump connected through a pipe, for example. Each of the two substrate transport mechanisms MHU1, MHU2 includes two hands 21, but may include three or more hands 21.

The forward/rearward driving unit 23 supports each of the hands 21 movably, and moves each of the hands 21 forward and backward. In order to drive one hand 21, the forward/rearward driving unit 23 includes, for example, an electric motor, a straight screw shaft, a movable member having a hole portion engaging with the screw shaft, and a guide unit for guiding the movable member.

The lifting/lowering rotation driving unit 25 lifts, lowers, and rotates the forward/rearward driving unit 23 to thereby lift, lower, and rotate the two hands 21. As shown in FIG. 6, the lifting/lowering rotation driving unit 25 includes a strut portion 25A and a rotating portion 25B. The strut portion 25A extends in the upward/downward direction. The strut portion 25A is fixed to the floor of the ID block 2. Accordingly, the position of the strut portion 25A (i.e., the lifting/lowering rotation driving unit 25) in the horizontal direction (XY direction) is fixed without being moved. The rotating portion 25B rotates forward/rearward driving unit 23 about a vertical axis AX1. An electric motor causes the lifting/lowering rotation driving unit 25 to perform the lifting, lowering, and rotating.

(1-1-3) Configuration of Substrate Buffer BF

The substrate buffer BF places a plurality of substrates W thereon. As shown in FIG. 4, the substrate buffer BF is disposed in the middle (center) of the first treating block 3 and the second treating block 5. Thus, both the first treating block 3 and the second treating block 5 are capable of loading and unloading the substrate W with respect to the substrate buffer BF. The substrate buffer BF is provided with two buffer units BU1, BU2, as shown in FIG. 3. A plurality of substrate platforms 31 is arranged by gaps in a row in the vertical direction.

The first buffer unit BU1 is provided corresponding to the two treatment layers A1, B1. That is, the first buffer unit BU1 is provided in the same level (i.e., the first floor) as the first treatment layer A1 of the first treating block 3 and the first treatment layer B1 of the second treating block 5. Moreover, the second buffer unit BU2 is provided in correspondence to the two treatment layers A2, B2. That is, the second buffer unit BU2 is provided in the same level (i.e., the second floor) as the second treatment layer A2 of the first treating block 3 and the second treatment layer B2 of the second treating block 5.

Next, two buffer units BU1, BU2 will be described with reference to FIG. 8. The two buffer units BU1, BU2 each include a plurality of (e.g., 16) substrate platforms 31. A plurality of substrate platforms 31 is arranged by gaps in a row in the vertical direction. In each of the two buffer units BU1, BU2, the substrate platforms 31 are supported by four frames 33 extending in the vertical direction at the four corners.

Figure 8:
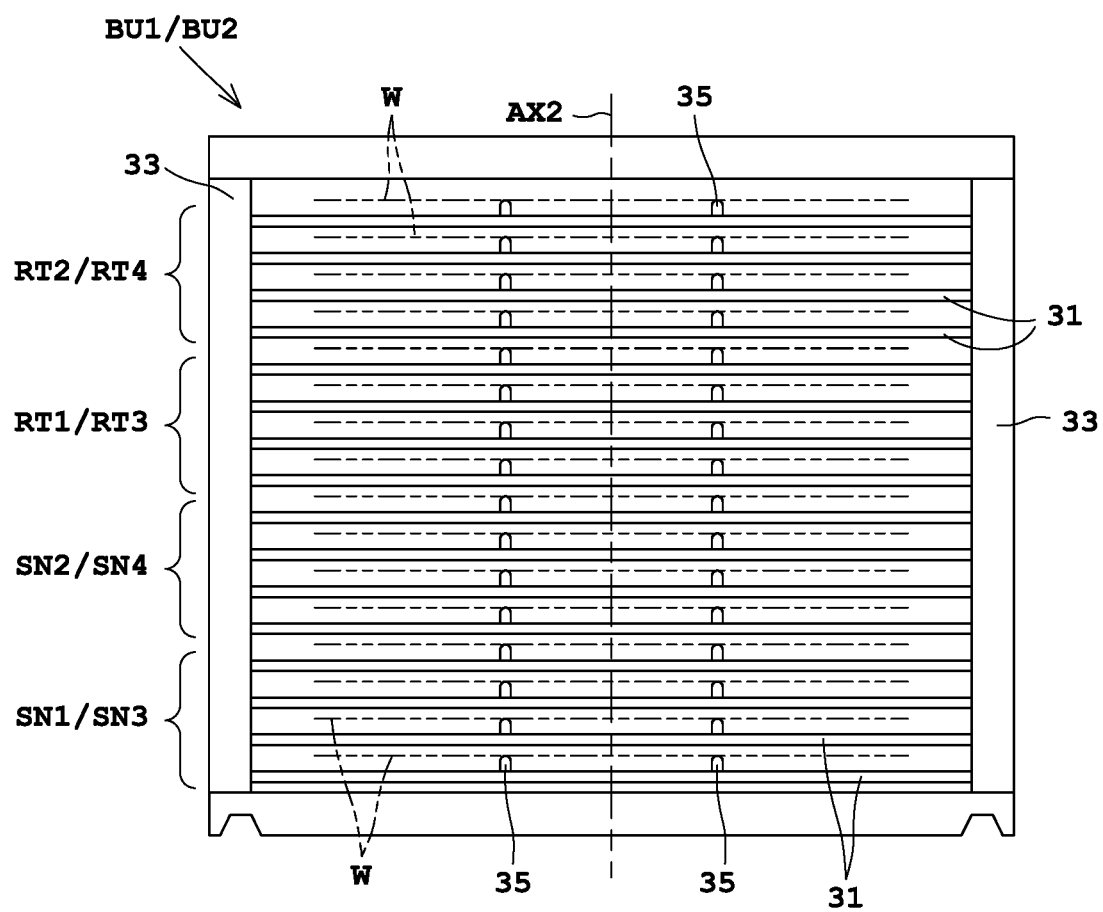
FIG. 8 illustrates a buffer unit.
Figure 9:
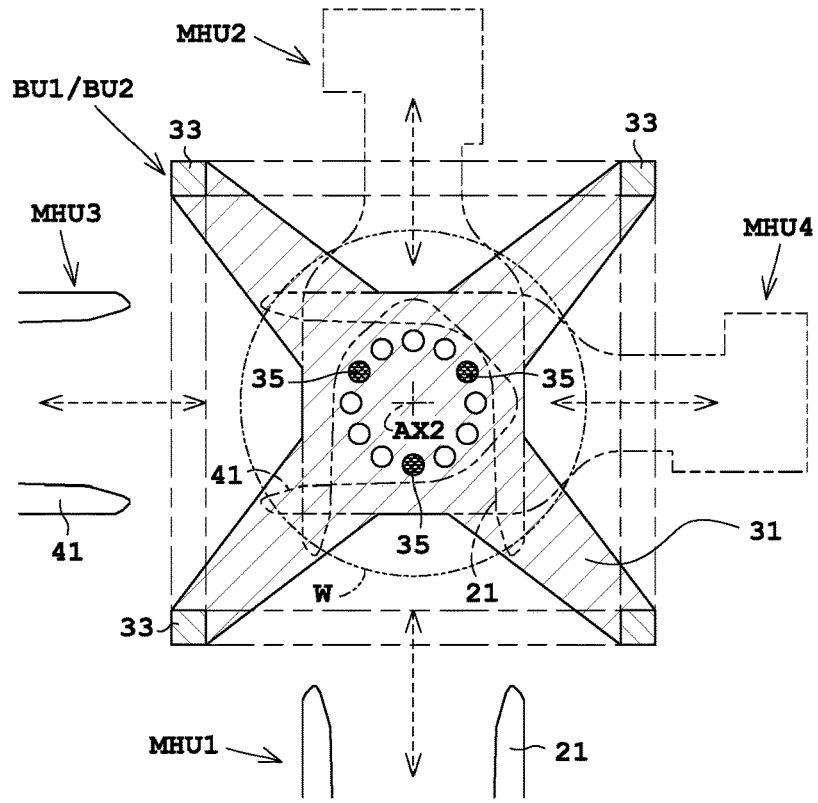
FIG. 9 illustrates a substrate platform.
Figure 10:
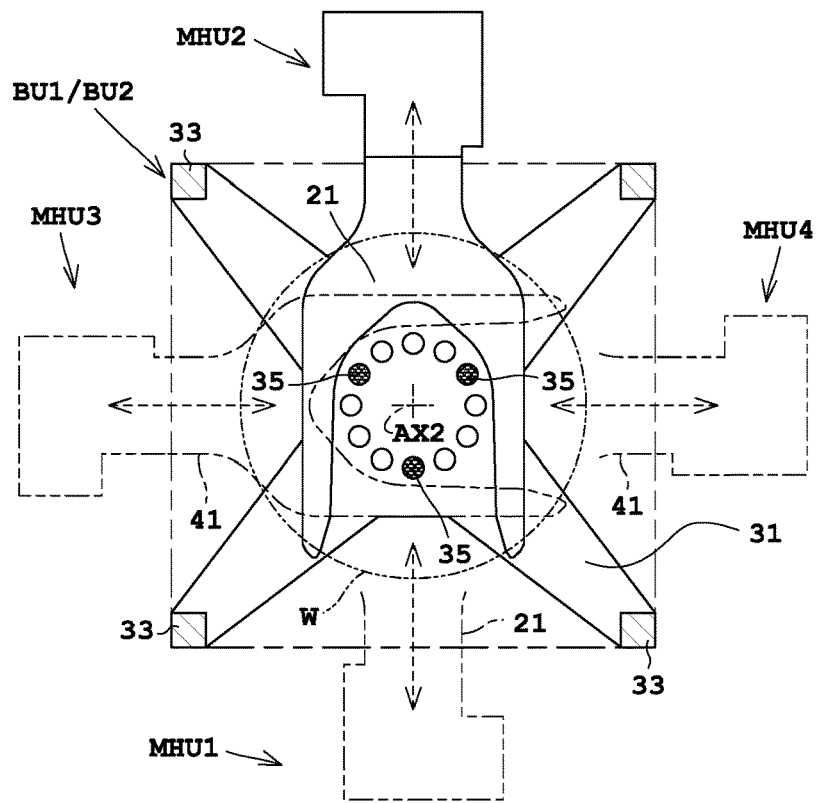
FIG. 10 illustrates that the substrate platform can be accessed from four directions.

As shown in FIG. 8, each of the substrate platforms 31 is formed in a thin plate shape in side view. As shown in FIG. 9, each of the substrate platforms 31 is formed in an X-shape in top view. Three support pins 35 for supporting one substrate W are provided in the central portion of each substrate platform 31, the central portion corresponding to a portion where the X-shaped substrate platforms 31 intersect. The three support pins 35 are spaced at equal intervals (in 120-degree intervals) about the vertical axis AX2. With such a construction, the hand 21 (41) enables entering into a space above the substrate platform 31 (i.e., a gap between two adjacent substrate platforms 31) from the four horizontal directions as shown in FIG. 10. Thus, in each of the four horizontal directions, the hand 21 (41) enables placing and taking of a substrate W on and from the three support pins 35.

Each hand 21 of the first substrate transport mechanism MHU1 approaches each of the substrate platforms 31 from the lower side of the paper plane of FIG. 10. Likewise, each hand 21 of the second substrate transport mechanism MHU2 approaches each substrate platform 31 from the upper side of the paper plane of FIG. 10. Each hand 41 of the first treating block 3 approaches each substrate platform 31 from the left side of the paper plane of FIG. 10. Each hand 41 of the second treating block 5 approaches each substrate platform 31 from the right side of the paper plane of FIG. 10. In order to prevent interference among the hands 21, 41, when one of the hands 21 (41) from a predetermined direction enters a space above a particular substrate platform 31, the other hands 21 (41) from the other three directions are configured not to enter the space above the particular substrate platform 31.

Also, the two substrate transport mechanisms MHU1, MHU2 and the two substrate transport mechanisms MHU3, MHU4 of the two treating blocks 3, 5, which will be described later, each enable placing and taking of a substrate W on and from all the substrate platforms 31 of the two buffer units BU1, BU2. Thereby, the two substrate transport mechanisms MHU1, MHU2 and the two substrate transport mechanisms MHU3, MHU4 are configured so as to be capable of taking a substrate W placed on the substrate buffer BF (or a predetermined substrate platform 31).

The buffer unit BU1 includes sixteen substrate platforms 31. As shown in FIG. 8, the buffer unit BU1 includes two feed units SN1, SN2 and two return units RT1, RT2. Each of the two feed units SN1, SN2 includes four substrate platforms 31, for example. Further, each of the two return units RT1, RT2 includes four substrate platforms 31, for example. Similarly to the buffer unit BU1, the buffer unit BU2 includes two feed units SN3, SN4 and two return units RT3, RT4. Each of the two feed units SN3, SN4 includes four substrate platforms 31, for example. Further, each of the two return units RT3, RT4 includes four substrate platforms 31, for example.

(1-2) Configuration of Treating Blocks 3 and 5

Reference is made to FIGS. 3 and 4. The first treating block 3 includes two treatment layers A1, A2. The two treatment layers A1, A2 are arranged vertically so as to stack. The second treating block 5 includes two treatment layers B1, B2. The two treatment layers B1, B2 are arranged vertically so as to stack. The first treating block 3 (each of the treatment layers A1, A2) performs a coating treatment as the first treatment, for example. The second treating block 5 (each of the treatment layers B1, B2) perform the coating treatment as a second treatment, for example. That is, the second treating block 5 performs the same treatment as the treatment by the first treating block 3. This yields increase in number of substrates subjected to parallel treatment.

Each of the two treatment layers A1, A2 includes a third substrate transport mechanism MHU3, a plurality of coating units SC, a plurality of heat-treatment units 37, and a transportation space 39. Each of the two treatment layers B1, B2 includes a fourth substrate transport mechanism MHU4, a plurality of coating units SC, a plurality of heat-treatment units 37, and a transportation space 39. The transportation space 39 is configured to extend linearly in the X-direction. That is, the transportation space 39 is a longitudinal space in the X-direction. Each of substrate transport mechanisms MHU3, MHU4 is provided in transportation space 39. The coating unit SC and the heat-treatment unit 37 are arranged across the transportation space 39, and are arranged in the longitudinal direction of the transportation space 39.

(1-2-1) Configuration of Substrate Transport Mechanisms MHU3, MHU4

Each of the substrate transport mechanisms MHU3, MHU4 includes two hands 41, a forward/rearward driving unit 43, a rotation driving unit 45, a first movement mechanism 47, and a second movement mechanism 48. The two hands 41, the forward/rearward driving unit 43, and the rotation driving unit 45 are configured in the same manner as that of the two hands 21, the forward/rearward driving unit 23 and the rotating portion 25B of the first substrate transport mechanism MHU1, respectively, for example. That is, each of the two hands 41 holds a substrate W. Each of the two hands 41 has one basic part and two tip parts branched from the basic part. Three suction portions for holding a substrate W by sucking the substrate W are each provided on the basic part and the two tip parts, respectively.

Moreover, each of the two hands 41 is movably attached to the forward/rearward driving unit 43. The forward/rearward driving unit 43 moves the two hands 41 forward and backward individually. The rotation driving unit 45 rotates the forward/rearward driving unit 43 about the vertical axis AX3. This achieves variation in direction of the two hands 41. The first movement mechanism 47 enables the rotation driving unit 45 to move in the forward/rearward direction (X direction) of FIG. 3. The second movement mechanism 48 enables the first movement mechanism 47 to move in the vertical direction (Z direction) of FIG. 3. The two movement mechanisms 47, 48 enable the two hands 41 and the forward/rearward driving unit 43 to move in the X and Z directions.

The forward/rearward driving unit 43, the rotation driving unit 45, the first movement mechanism 47, and the second movement mechanism 48 each include an electric motor. Here, the third substrate transport mechanism MHU3 corresponds to the first transport mechanism of the present invention. The fourth substrate transport mechanism MHU4 corresponds to the second transport mechanism of the present invention.

(1-2-2) Arrangement of Coating Unit SC

Figure 11:
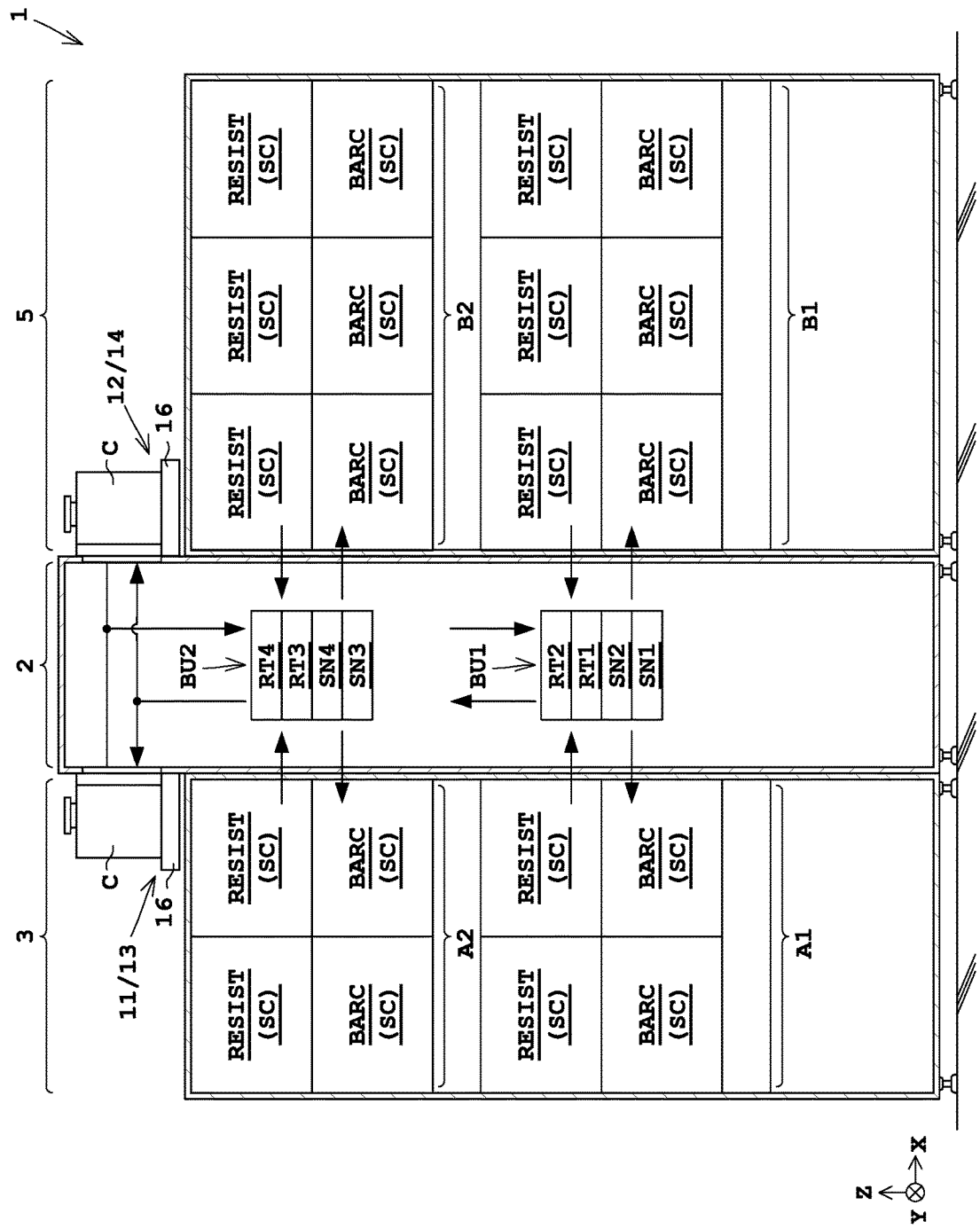
FIG. 11 is a right side view of the substrate treating apparatus according to the first embodiment.

FIG. 11 is a right side view of the substrate treating apparatus 1. The treatment layers A1, A2 each include four coating units SC. The four coating units SC are arranged in two levels in the vertical direction and two lines in the horizontal direction. Also, the two treatment layers B1, B2 each include six developing units DEV. The six coating units SC are arranged in two levels and three lines.

In FIG. 11, two lower coating units SC in each of the treatment layers A1, A2 are coating units BARC, for example. The two upper coating units SC are coating units RESIST, for example. Moreover, the three lower coating units SC in each of the treatment layers B1, B2 are coating units BARC, for example. The three upper coating units SC are coating units RESIST, for example. The coating unit BARC forms an antireflection film on a substrate W. The coating unit RESIST forms a resist film, such as a photoresist, on the substrate W.

As shown in FIG. 4, the coating units SC each include a holding rotation portion 51 nozzles 52, and a nozzle moving mechanism 53. The holding rotation portion 51 holds the lower surface of a substrate W by, for example, vacuum adsorption, and rotates the held substrate W around the vertical axis (Z direction). The nozzles 52 dispense the coating liquid (e.g., photoresist liquid) to the substrate W. Each of the nozzles 52 is connected to a coating liquid supply source via a pipe on which a pump and on-off valve are provided. The nozzle moving mechanism 53 moves the nozzles 52 to any position. The holding rotation portion 51 and the nozzle moving mechanism 53 each include an electric motor, for example.

(1-2-3) Configuration of Heat-Treatment Unit 37

Figure 12:
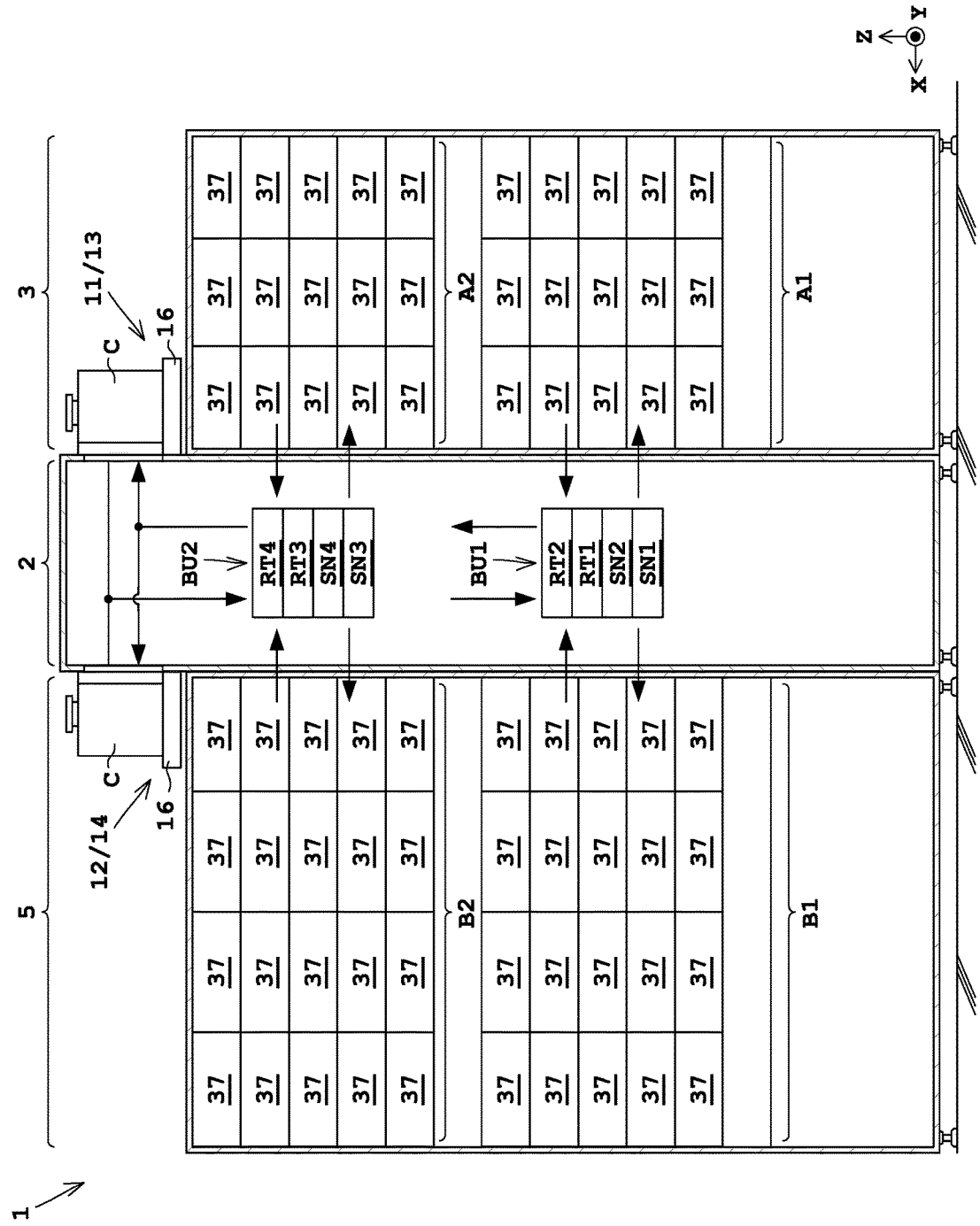
FIG. 12 is a left side view of the substrate treating apparatus according to the first embodiment.

FIG. 12 is a left side view of the substrate treating apparatus 1. Each of the two treatment layers A1, A2 includes fifteen heat-treatment units 37. The fifteen heat-treatment units 37 are arranged in five levels and three lines. Further, each of the two treatment layers B1, B2 includes twenty heat-treatment units 37. The twenty heat-treatment units 37 are arranged in five levels and four lines.

The heat-treatment units 37 each include a plate 55 for placing a substrate W in order to perform heat treatment on the substrate W (see FIG. 4). When heating the plate 55, the heat-treatment unit 37 includes a heater, for example. When cooling the plate 55, the heat-treatment unit 37 includes a water-cooled circulation mechanism, for example. The heat-treatment units 37 are each comprised of a heating/cooling unit PHP and a cooling unit CP, for example. The heating/cooling unit PHP performs a heat treatment and a cooling treatment in this order. The cooling unit CP cools the substrates W. Note that the numbers of the heating/cooling units PHP and the cooling units CP are arbitrary. Further, the heat-treatment unit 37 is not limited to a heating/cooling unit PHP and a cooling unit CP, and may be at least one of an adhesion enhancing treatment unit PAHP, an edge exposing unit EEW, and a heating unit HP, for example. That is, the type of the heat-treatment unit 37 is arbitrary.

It should be noted that the adhesion enhancing treatment unit PAHP is configured to apply an adhesion enhancing agent such as hexamethyldisilazane (HMDS) to substrates W and heats the resulting substrates W to enhance adhesion of the substrates W to a resist, for example. The edge exposing units EEW expose a periphery edge of a substrate W. The heating unit HP heats substrate W.

(1-3) Configuration of Carrier Buffer Device 8

The carrier buffer device 8 includes a carrier transport mechanism 61, and carrier storage shelves 63 as shown in FIGS. 3 and 5. The carrier transport mechanism 61 and the carrier storage shelves 63 (i.e., carrier buffer device 8) are mounted on the ID block 2 and the two treating blocks 3, 5. The carrier transport mechanism 61 transports a carrier C between the platform 16 of each of the four openers 11 to 14 and the carrier storage shelves 63. The carrier storage shelf 63 stores a carrier C.

Figure 13:
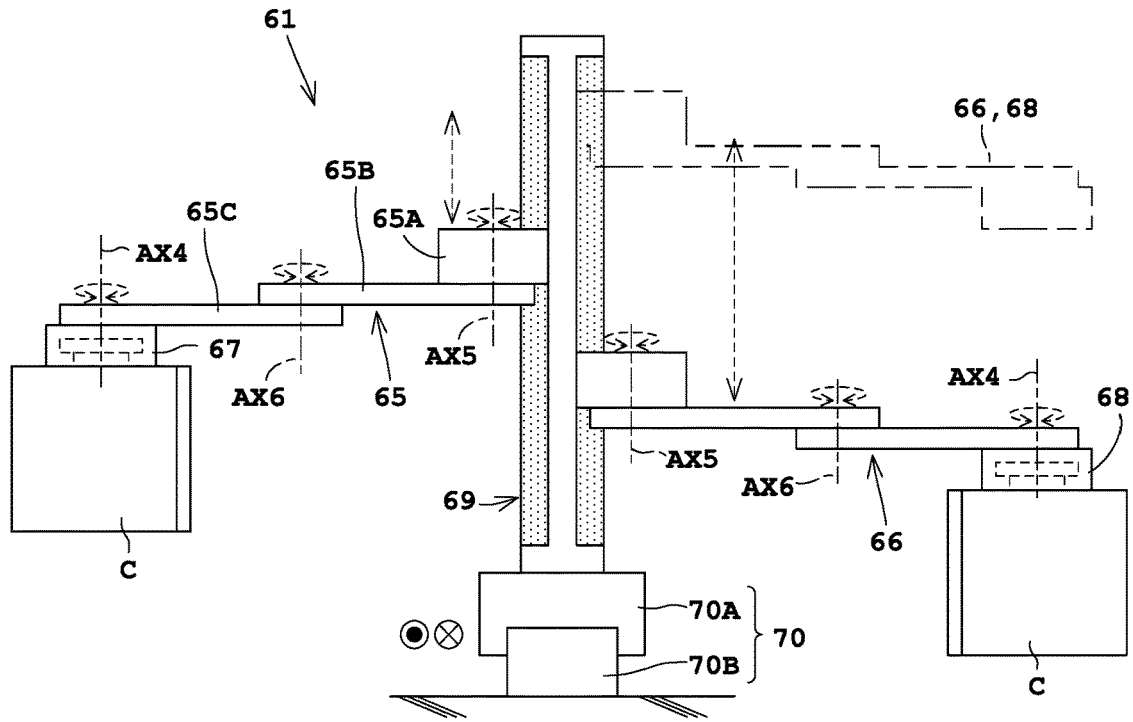
FIG. 13 illustrates a carrier transport mechanism.

Reference is made to FIG. 13. The carrier transport mechanism 61 includes two articulated arms 65, 66. A first articulated arm 65 includes a first end with a gripper 67, and a second articulated arm 66 includes a first end with a gripper 68. The first articulated arm 65 includes a second end supported on a strut lifting/lowering driving unit 69 so as to be movable in the upward/downward direction. The second articulated arm 66 includes a second end supported on the lifting/lowering driving unit 69 so as to be movable in the upward/downward direction.

Each of the two grippers 67, 68 is configured to grasp a projection provided on a top face of the carrier C, for example. The first articulated arm 65 is configured to allow gripper 67 to rotate 360 degrees about the vertical axis AX4. The first articulated arm 65 includes three arm members 65A to 65C, for example. The arm member 65A is supported on the lifting/lowering driving unit 69 to be described later so as to be movable upward/downward. The two arm members 65A, 65B are rotatably connected around a vertical axis AX5. Further, the two arm members 65B, 65C are rotatably connected around a vertical axis AX6. The second articulated arm 66 is configured in the same manner as that of the first articulated arm 65. The first articulated arm 65 may be in charge of transporting a carrier C on the upper side of the paper plane of FIG. 5, for example. The first articulated arm 66 may be in charge of transporting a carrier C on the lower side of the paper plane of FIG. 5, for example.

The lifting/lowering driving unit 69 is configured to allow the two articulated arms 65, 66 to be movable upward/downward individually. Accordingly, the first articulated arm 65 may be moved to a position higher than that of the second articulated arm 66, or the first articulated arm 65 may be moved to a position lower than that of the second articulated arm 66. The lifting/lowering driving unit 69 may be configured to move the two articulated arms 65, 66 upward/downward integrally. Each of the two grippers 67, 68, the two articulated arms 65, 66 and the lifting/lowering driving unit 69 includes an electric motor.

A forward/backward driving unit 70 includes a supporting portion 70A for supporting the lifting/lowering driving unit 69, a longitudinal portion 70B extending longitudinally in the forward/rearward direction (X direction), and an electric motor. For instance, the longitudinal portion 70B may be a rail (guide rail) and the supporting portion 70A may be a carriage. In this case, the electric motor may be configured to cause the carriage (supporting portion 70A) to move along the rail (longitudinal portion 70B).

Moreover, the electric motor, a plurality of pulleys, a belt, and a guide rail may be accommodated in the longitudinal portion 70B, and the supporting portion 70A may be fixed to the belt, for example. In this case, the electric motor may cause the pulleys to rotate to move the belt on the pulleys, whereby supporting portion 70A is moved along the guide rail. Moreover, the electric motor, a screw shaft, and the guide rail may be accommodated in the longitudinal portion 70B, and a nut configured to engage with the screw shaft may be provided in the supporting portion 70A, for example. In this case, the electric motor may cause the screw shaft to rotate to move the supporting portion 70A along the guide rail.

Reference is made to FIG. 5. The carrier storage shelves 63 include input ports 71, output ports 72, untreated substrate carrier shelves 73, empty carrier shelves 74, and treated substrate carrier shelves 75. The input ports 71 are each a shelf for receiving a carrier C where untreated substrates W are accommodated from an external transport mechanism OHT (overhead hoist transport). The external transport mechanism OHT transports a carrier C in the factory. The term untreated means the condition where the substrate treating apparatus 1 performs no treatment in this embodiment. The two input ports 71 and the two output ports 72 are provided at one end in the longitudinal direction (X direction) of the roof of the substrate treating apparatus 1, as shown in FIG. 5. The two input ports 71 and the two output ports 72 are arranged in a lateral direction (Y direction) perpendicular with respect to the longitudinal direction. Above the two input ports 71 and the two output ports 72, a rail 77 of the external transport mechanism OHT is provided. The external transport mechanism OHT transports a carrier C to one of the two input ports 71.

The untreated substrate carrier shelf 73 accommodates a carrier C which is placed on the input port 71, the carrier C being transported to neither of the platforms 16 of the openers 11, 12 and accommodating untreated substrates W. The empty carrier shelf 74 accommodates a carrier C from which all the substrates W are taken on the platform 16 of the opener 11, for example. The treated substrate carrier shelf 75 accommodates a carrier C accommodating treated substrates W and not capable of being transported to either of the two output ports 72. The term treated means the condition where the substrate treating apparatus 1 performs any treatment. The output ports 72 are each a shelf for delivering a carrier C where the treated substrates W are accommodated to the external transport mechanism OHT. The carrier transport mechanism 61 is capable of freely moving the carrier C between the platforms 16 and each of the shelves 71 to 75.

The carrier transport mechanism 61 includes the two articulated arms 65, 66 and two grippers 67, 68. Alternatively, one or three or more articulated arms, and one or three or more (the same number as the number of articulated arms) grippers may be provided. Further, the lifting/lowering driving unit 69 may be configured to be rotatable about a vertical axis (axis in the Z direction) with respect to the supporting portion 70A.

Figure 14:
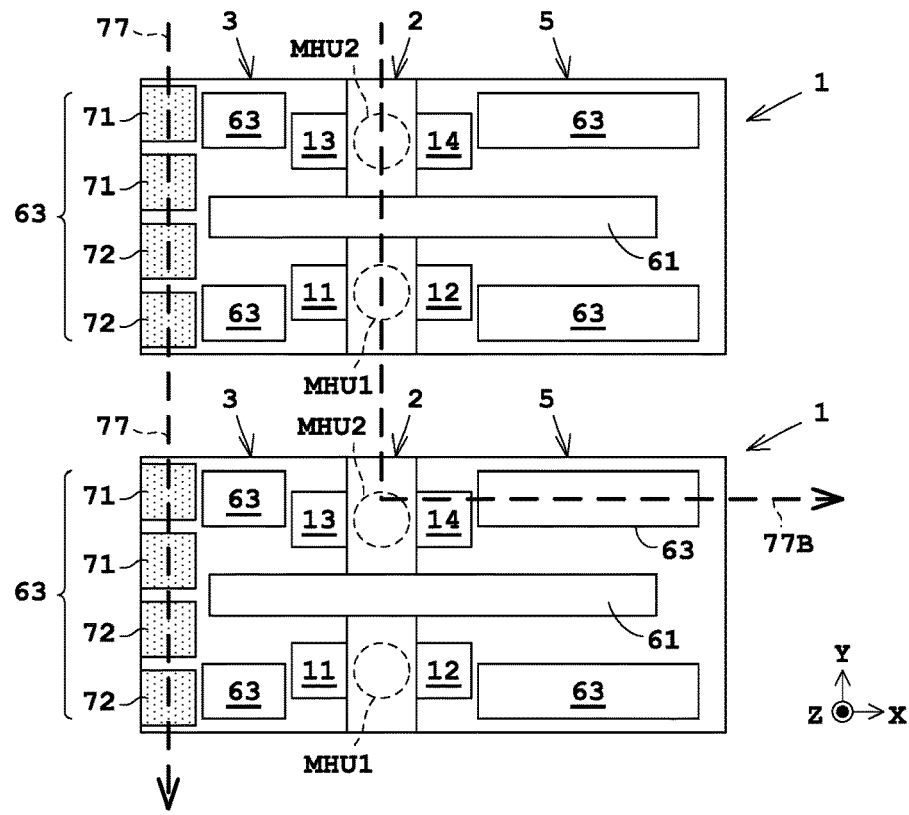
FIG. 14 illustrates how to install a plurality of substrate treating apparatus.

Now the following describes a method of installing a plurality of the substrate treating apparatuses 1. In a mass-production factory, the external transport mechanism OHT needs receiving portions for carriers C (ports 71 and 72) below the rail 77 in order to load and unload the carriers C into and from the substrate treating apparatuses 1. As shown in FIG. 14, the external transport mechanism OHT transports carriers C to a plurality (two in FIG. 14) of substrate treating apparatuses 1. Here, in a limited space inside the factory, it is preferable that the receiving portions of each substrate treating apparatus 1 are arranged collectively below the rail 77 so that the external transport mechanism OHT efficiently transports carriers C to each substrate treating apparatus 1. Accordingly, a position and a direction of installing each substrate treating apparatus 1 are determined so that only the receiving portions for carriers C are disposed below the rail 77. For example, as shown in FIG. 14, the substrate treating apparatuses 1 are arranged side by side (Y-direction) to achieve compact arrangement in the mass-production factory. Moreover, the substrate treating apparatuses 1 are installed in the same direction so that the receiving portions for the carrier C are disposed below the rail 77.

Further, the rail 77 may be configured to pass over any location of the substrate treating apparatus 1. For example, the rail 77B may be configured so as to pass over at least one of the ID block 2 and two treating blocks 3, 5, as shown in FIG. 14. In this case, the input ports 71 and the output ports 72 are provided below the rail 77B. Since the area of the ID block 2 and two treating blocks 3, 5 (XY-direction) on which the input ports 71 and the output ports 72 can be mounted is relatively large, the path of the rail 77B of the external transport mechanism OHT is settable relatively freely. Consequently, the substrate treating apparatuses 1 can be installed relatively freely for the path of the rail 77B of the external transport mechanism OHT. Moreover, the number and type of carrier storage shelves 63 are appropriately changed.

(2) Operation of Substrate Treating Apparatus 1

Figure 15:
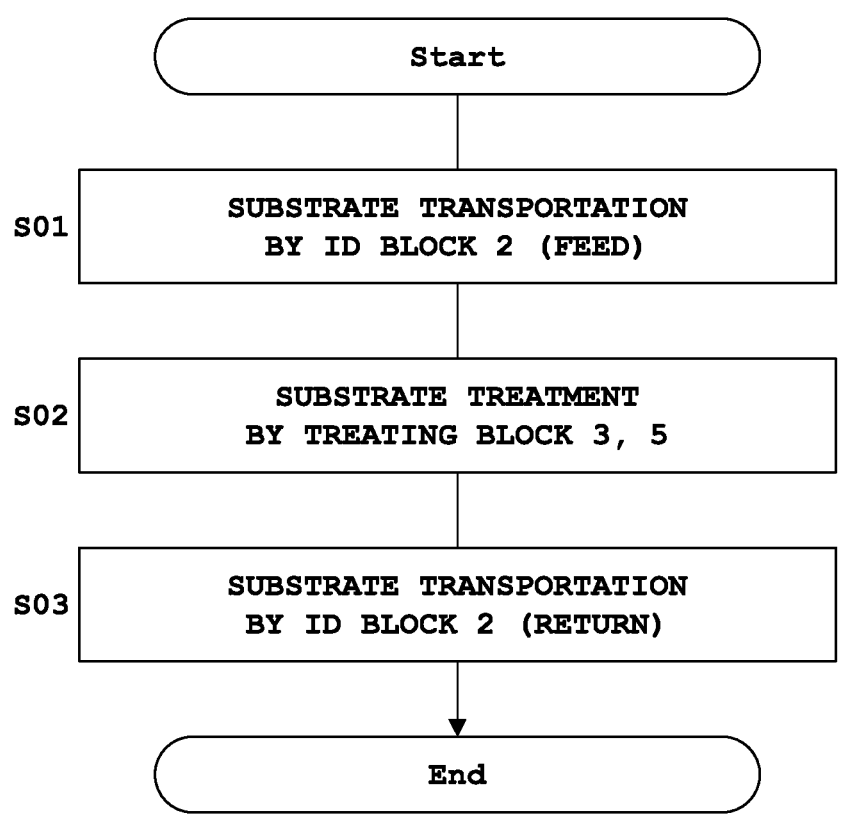
FIG. 15 is a flowchart illustrating operation of the substrate treating apparatus according to the first embodiment.

The following describes operation of the substrate treating apparatus 1. In FIG. 5, the two openers 11, 12 are used to take substrates W from a carrier C, and the remaining two openers 13, 14 are used to store substrates W in a carrier C. Moreover, FIG. 15 is a flowchart illustrating the operation of the substrate treating apparatus 1 according to the first embodiment.

Reference is made to FIGS. 3 and 5. The external transport mechanism OHT transports the carrier C to either of the two input ports 71. The carrier transport mechanism 61 transports the carrier C transported by the external transport mechanism OHT from the input port 71 to the platform 16 of one of the two openers 11, 12 (e.g., opener 11). The shutter member of the opener 11 moves the lid while removing and holding the lid from the carrier C (carrier body). This releases the opening 18.

[Step S01] Substrate Transportation by ID Block 2 (Feed)

The ID block 2 takes a substrate W from the carrier C placed on the platform 16 of the opener 11. The ID block 2 then enables one of the two treating blocks 3, 5 to receive the substrate W.

Detailed description is as under. The first substrate transport mechanism MHU1 transports the substrate W to the openers 11, 12. The substrate transport mechanism MHU1 moves the hand 21 into the carrier C placed on the platform 16 of the opener 11 to take the substrate W from the carrier C. The substrate transport mechanism MHU1 transports the taken substrate W to the substrate buffer BF. When the treatment layer A1 treats the substrate W, the substrate transport mechanism MHU1 transports the substrate W to the feed unit SN1 of the first buffer unit BU1. When the treatment layer B1 treats the substrate W, the substrate transport mechanism MHU1 transports the substrate W to the feed unit SN2 of the first buffer unit BU1 (see FIG. 11). Likewise, when the treatment layer A2 treats the substrate W, the substrate transport mechanism MHU1 transports the substrate W to the feed unit SN3 of the second buffer unit BU2. When the treatment layer B2 treats the substrate W, the substrate transport mechanism MHU1 transports the substrate W to the feed unit SN4 of the second buffer unit BU2.

When all the substrates W are taken out from the carrier C, the shutter member of the opener 11 covers the opening 18 while moving to attach the lid to the carrier C. Thereafter, the carrier transport mechanism 61 transports the empty carrier C to either of the two openers 13, 14. Also, when the empty carrier C is transportable to neither of the two openers 13, 14, the carrier transport mechanism 61 transports the empty carrier C to an empty carrier shelf 74. Further, the carrier transport mechanism 61 transports the carrier C in which the untreated substrate W is accommodated, instead of the empty carrier C, from the input ports 71 or the untreated substrate carrier shelf 73 to the opener 11.

After taking all the substrates W from the carrier C of the opener 11, the substrate transport mechanism MHU1 takes the substrate W from the carrier C of the opener 12. The substrate transport mechanism MHU1 takes all the substrates W from the carrier C of the opener 12, and then takes the substrates W from the carrier C of the opener 11 again. That is, the substrate transport mechanism MHU1 takes substrates W from each of the carriers C of the two openers 11, 12 alternately in a carrier-by-carrier basis in principle.

The substrate transport mechanisms MHU1 is configured to distribute the substrates W on a carrier-by-carrier basis. For example, the substrates W taken from the first carrier C of the opener 11 are treated in the treatment layer A1. Next, the substrates W taken from the second carrier C of the opener 12 are treated in the treatment layer B1. Further next, the substrates W taken from the third carrier C of the opener 11 are treated in the treatment layer A2. Further next, the substrates W taken from the fourth carrier of the opener 12 are treated in the treatment layer B2. That is, the substrates W are distributed on a carrier-by-carrier basis to the treatment layer A1, the treatment layer A2, the treatment layer B1, and the treatment layer B2 repeatedly in this order.

The distribution of the substrates W is not limited to the above methods. For example, the substrate W taken from the first carrier C may be treated in the two treatment layers A1, A2 and the substrate W taken from the second carrier C may be treated in the two treatment layers B1, B2. Alternatively, the substrates W taken from the first carrier C may be treated in the four treatment layers A1, A2, B1, and B2. In this case, the ID block 2 enables both the two treating blocks 3, 5 to receive the substrates W.

[Step S02] Substrate Treatment by Treating Block 3, 5

Each of the two treatment layers A1, A2 of the first treating block 3 receives a substrate W from the ID block 2, and performs a coating treatment on the received substrate W. Then, each of the treatment layers A1, A2 transports the substrate W, subjected to the coating treatment, to the substrate buffer BF of the ID block 2.

Detailed description is as under. The substrate transport mechanism MHU3 of the treatment layer A1 receives the substrate W placed on the feed unit SN1 of the first buffer unit BU1. The substrate transport mechanism MHU3 then transports the received substrate W to the cooling unit CP, the coating unit BARC, and the heating/cooling unit PHP in this order. Thereafter, the substrate transport mechanism MHU3 transports the substrate W on which an antireflection film is formed by the coating unit BARC to the cooling unit CP, the coating unit RESIST, and the heating/cooling unit PHP in this order. Thereafter, the substrate transport mechanism MHU3 transports the substrate W on which a resist film is formed by the coating unit RESIST to the return unit RT1 of the first buffer unit BU1.

When the treatment layer A2 performs the coating treatment on substrate W, the substrate transport mechanism MHU3 of the treatment layer A2 transports the substrate W on which a resist film is formed to the return unit RT3 of the second buffer unit BU2.

Further, the case where the second treating block 5 performs a coating treatment will be described. Each of the two treatment layers B1, B2 of the second treating block 5 receives a substrate W from the ID block 2, and performs a coating treatment on the received substrate W. Then, each of the treatment layers B1, B2 transports the substrate W, subjected to the coating treatment, to the substrate buffer BF of the ID block 2.

Detailed description is as under. The substrate transport mechanism MHU4 of the treatment layer B1 receives a substrate W placed on the feed unit SN2 of the first buffer unit BU1. The substrate transport mechanism MHU4 then transports the received substrate W to the cooling unit CP, the coating unit BARC, and the heating/cooling unit PHP in this order. Thereafter, the substrate transport mechanism MHU4 transports the substrate W on which an antireflection film is formed by the coating unit BARC to the cooling unit CP, the coating unit RESIST, and the heating/cooling unit PHP in this order. Thereafter, the substrate transport mechanism MHU4 transports the substrate W on which a resist film is formed by the coating unit RESIST to the return unit RT2 of the first buffer unit BU1.

When the treatment layer B2 performs the coating treatment on the substrate W, the substrate transport mechanism MHU4 of the treatment layer B2 transports the substrate W on which a resist film is formed to the return unit RT4 of the second buffer unit BU2.

[Step S03] Substrate Transportation by ID Block 2 (Return)

The ID block 2 returns the substrate W transported from the first treating block 3 or the second treating block 5 to the carrier C placed on the platform 16 of the opener 13, for example. The carrier C for returning the substrate W is a carrier C where the substrates W were accommodated before treatment (i.e., before taking out).

Detailed description is as under. The carrier transport mechanism 61 transports the empty carrier C from the platform 16 of the two openers 11, 12 or the empty carrier shelves 74 to the platform 16 of one of the two openers 13, 14 (e.g., opener 13). The second substrate transport mechanism MHU2 transports the substrate W to the openers 13, 14.

The substrate transport mechanism MHU2 transports the substrate W treated in the treatment layer A1 from the return unit RT1 of the first buffer unit BU1 to the carrier C placed on the platform 16 of the opener 13. The transportation of the substrate W subjected to the coating treatment by each of the other treatment layers B1, A2, and B2 will be described. The first buffer unit BU1 includes the return unit RT2, and the second buffer units BU2 includes the two return units RT3, RT4. The substrate transport mechanism MHU2 transports the substrate W treated in the treatment layer B1 from the return unit RT2 to the carrier C of the platform 16 of the opener 13. The substrate transport mechanism MHU2 also transports the substrate W treated in the treatment layer A2 from the return unit RT3 to the carrier C of the platform 16. In addition, the substrate transport mechanism MHU2 transports the substrate W treated in the treatment layer B2 from the return unit RT4 to the carrier C of the platform 16.

The substrate transport mechanism MHU 2 accommodates all the substrates W in the carrier C of the opener 13, and then accommodates the substrates W in the carrier C of the opener 14. Thereafter, the substrate transport mechanism MHU2 accommodates all the substrates W in the carrier C of the opener 14, and then accommodates the substrates W in the carrier C of the opener 13. That is, the substrate transport mechanism MHU2 accommodates the substrates W in each of the carriers C of the openers 13, 14 alternately in a carrier-by-carrier basis in principle.

The carrier transport mechanism 61 transports the carrier C accommodating the treated substrate W to the output ports 72 or the treated substrate carrier shelves 75. The carrier transport mechanism 61 also transports the empty carrier C, instead of the transported carrier C, from the platform 16 of the two openers 11, 12 or the empty carrier shelves 74 to the platform 16 of either of the two openers 13, 14. The external transport mechanism OHT transports the carrier C accommodating the treated substrate W from either of the two output ports 72 to another device, for example.

According to this embodiment, the two treating blocks 3, 5 are not arranged so as to be stacked, but are arranged horizontally. Therefore, the number of the treatment layers (e.g., reference numeral A1) is increasable while the height of the substrate treating apparatus is suppressed. Moreover, as shown in FIG. 2, when the ID block 202, the first treating block 203 and the second treating block 205 are arranged in this order, for example, the operation of passing a substrate W through the first treating block 203 without performing a substrate treatment is required in order to perform a substrate treatment in the second treating block 205. Also, when returning the substrate W from the second treating block 205 to the ID block 202, the operation of passing the substrate W through the first treating block 203 is required. In this regard, each of the two treating blocks 3, 5 is directly connected to the ID block 2. Therefore, as shown in FIG. 2, the step of passing a substrate through the treating block 203 without performing the substrate treatment is suppressible, thereby preventing a decrease in throughput.

Further, the substrate treating apparatus 1 includes the carrier storage shelves 63 and the carrier transport mechanism 61. The carrier storage shelves 63 are mounted on at least one of the ID block 2, the first treating block 3 and the second treating block 5, and accommodates the carrier C. The carrier transport mechanism 61 is mounted on at least one of ID block 2, the first treating block 3 and the second treating block 5. The carrier transport mechanism 61 transports the carrier C between the platform 16 and the carrier storage shelves 63.

If the carrier storage shelf 63 and the carrier transport mechanism 61 are provided horizontally with respect to the ID block 2 and the two treating blocks 3, 5, then the footprint of the substrate treating apparatus 1 is increased accordingly. In this regard, the carrier storage shelf 63 and the carrier transport mechanism 61 are arranged to overlap in plan view with at least one of the ID block 2 and the two treating block 3, 5. As a result, suppressed increase in footprint of the substrate treating apparatus 1 is obtainable. This enables the substrate treating apparatus 1 to fit in a limited footprint.

Figure 16:
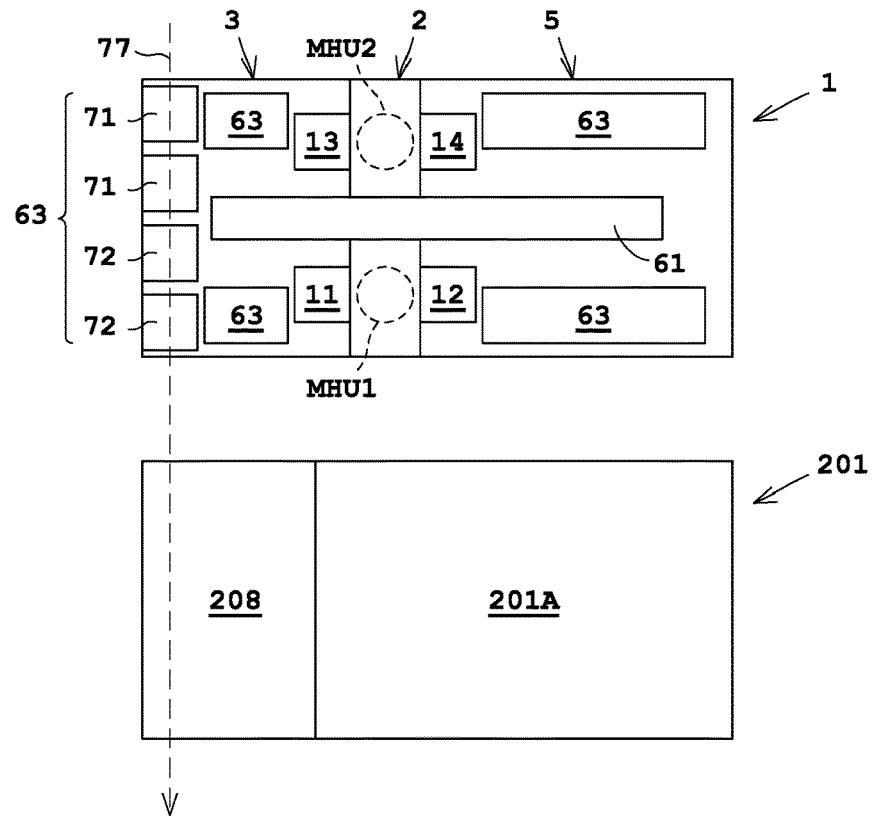
FIG. 16 illustrates effects of the substrate treating apparatus 1.

Moreover, as shown in FIG. 16 in the substrate treating apparatus 1 of this embodiment, a coating unit SC and a heat-treatment unit 37 may be installed instead of a carrier buffer device 208 of the currently-used substrate treating apparatus 201. In FIG. 16, the reference numeral 201A denotes a substrate treating apparatus main body. The main body 201A includes an ID block 202 and a treating block 203, for example.

The ID block 2 includes a substrate buffer BF for placing a plurality of substrates W and, for example, a substrate transport mechanism MHU1 therein. The substrate buffer BF is disposed in the middle of the first treating block 3 and the second treating block 5. The substrate transport mechanism MHU1 transports substrates W between a carrier C placed on the platform 16 and the substrate buffer BF. The first treating block 3 and the second treating block 5 are configured to be able to take the substrates W placed on the substrate buffer BF by the substrate transport mechanism MHU1.

Figure 17:
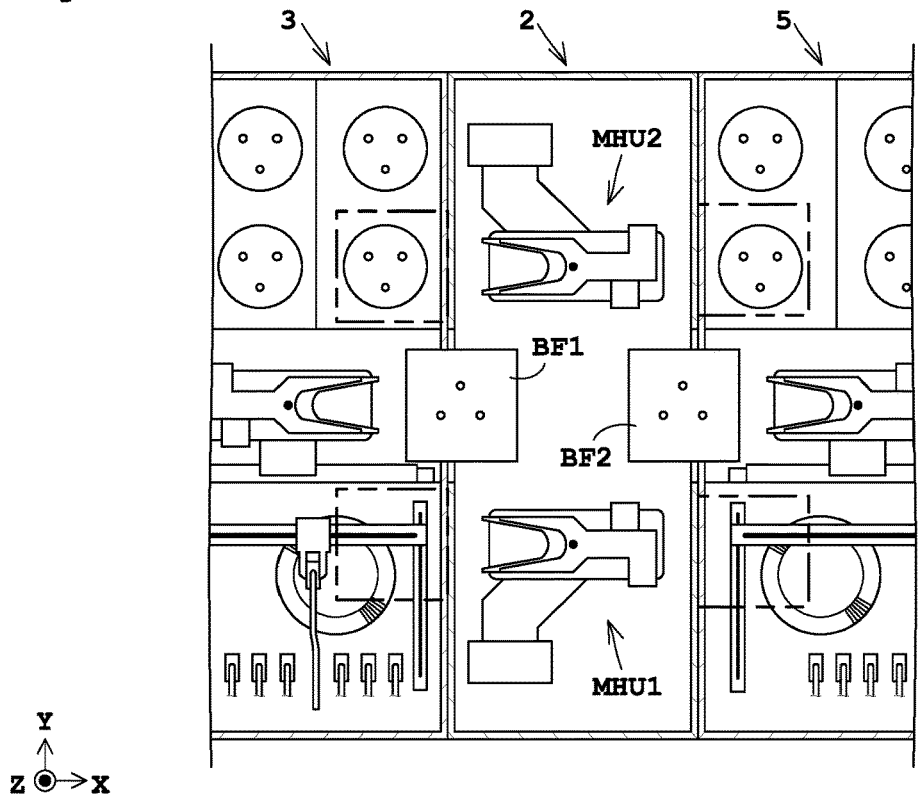
FIG. 17 illustrates two substrate buffers.

As shown in FIG. 17, it is assumed that a first substrate buffer BF1 is provided between the ID block 2 and the first treating block 3, and a second substrate buffer BF2 is provided between the ID block 2 and the second treating block 5. In this case, the first substrate buffer BF1 and the second substrate buffer BF2 are arranged in the direction (X direction) in which the two treating blocks 3, 5 are arranged. Therefore, the substrate treating apparatus 1 may be elongated in that direction (X direction). According to this embodiment, the substrate buffer BF is disposed in the middle of the two treating blocks 3, 5. Each of the two treating blocks 3, 5 transports substrates W to the substrate buffer BF. That is, the first substrate buffer BF1 and the second substrate buffer BF2 are stacked at the same position (i.e., at one position) in plan view. Therefore, the possibility of elongating the substrate treating apparatus is reduced.

Moreover, the two treating blocks 3, 5 (the substrate transport mechanisms MHU3, MHU4) are arranged across the substrate buffer BF (see FIG. 4). In addition, the two substrate transport mechanisms MHU1, MHU2 of the ID block 2 are arranged across the substrate buffer BF in the Y direction perpendicular with respect to the X direction in which the two treating blocks 3, 5 are arranged. This allows for taking the substrates W from four directions horizontally relative to the substrate buffer BF.

In this embodiment, the two treating blocks 3, 5 perform the coating treatment of the resist, for example. In this regard, at least either of the two treating blocks 3, 5 may perform a developing treatment or a cleaning treatment. In this case, a liquid treating unit for performing the developing treatment or the cleaning treatment may include a holding rotation portion for rotating a substrate W while holding the substrate W, a nozzle for dispensing a developer or a cleaning liquid, a pump for sending the developer or the cleaning liquid to the nozzle, a valve, and a pipe.

Second Embodiment

A second embodiment of the present invention will now be described with reference to the drawings. Here, the description common to that of the first embodiment is to be omitted.

In the first embodiment, the predetermined coating treatment is performed by each of the four treatment layers A1, A2, B1, and B2. In this regard, in the second embodiment, the predetermined coating treatment may be performed by each of a combination of the two treatment layers A1, B1 and another combination of the two treatment layers A2, B2.

Figure 18:
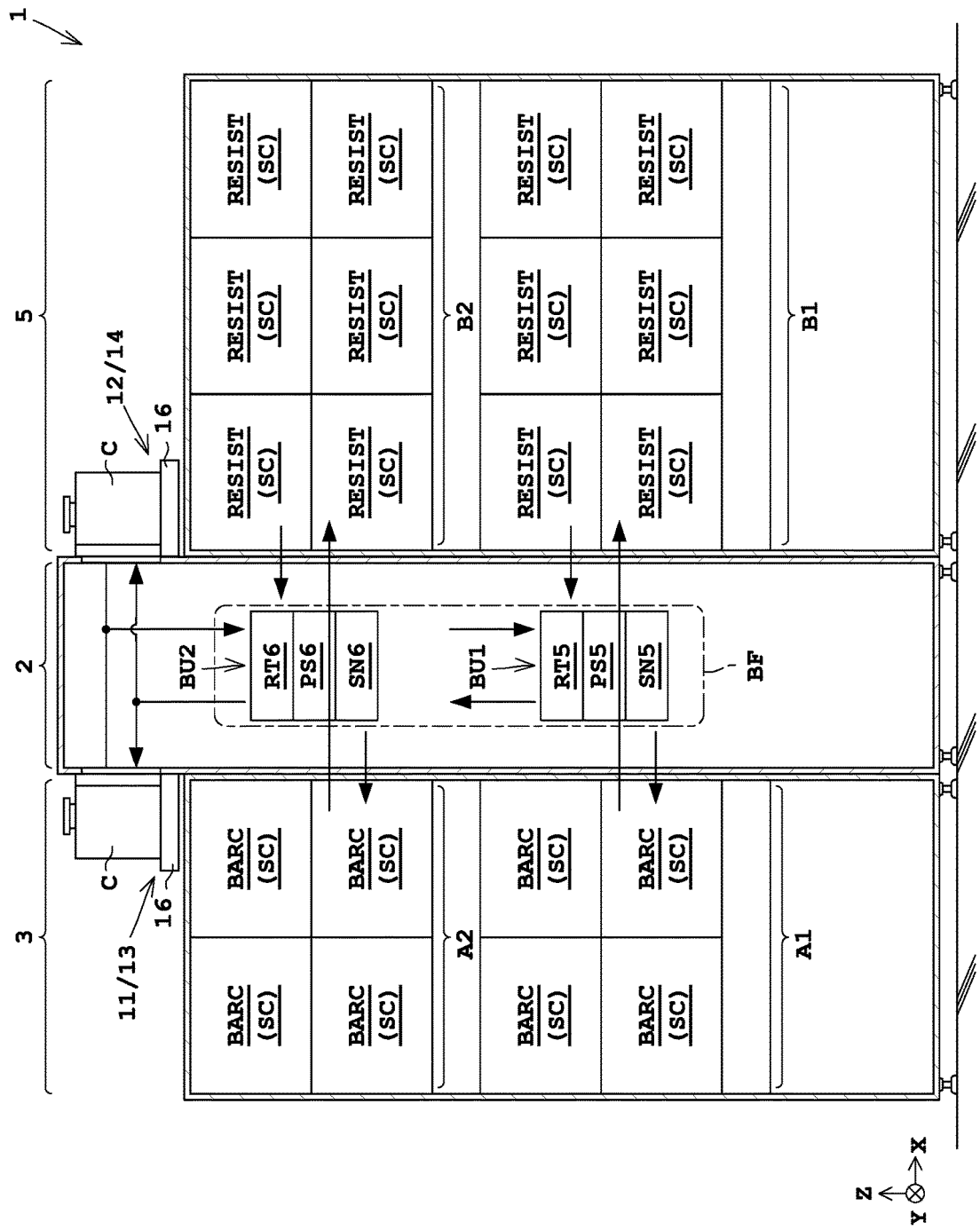
FIG. 18 is a right side view of the substrate treating apparatus according to a second embodiment.

Reference is made to FIG. 18. Each of the two treatment layers A1, A2 of the first treating block 3 includes four coating units BARC, for example. The treatment layers A1, A2 each perform a coating treatment of a liquid for forming antireflection films, and form an antireflection film on a substrate W. The treatment layer A1 performs the same treatment as the treatment by the treatment layer A2. Moreover, each of the two treatment layers B1, B2 of the second treating block 5 includes six coating units RESIST, for example. The treatment layers B1, B2 each perform a coating treatment of a resist liquid, and form a resist film on the antireflection film of the substrate W. The treatment layer B1 performs the same treatment as the treatment layer B2.

Each of the two treatment layers B1, B2 may include four coating units RESIST, like the four coating units BARC of the treatment layer A1. Also, each of the two treatment layers A1, A2 may include six coating units BARC, for example, and each of the two treatment layers B1, B2 may include four coating units RESIST, for example. In other words, in each of the treating blocks 3, 5, the numbers of the coating units BARC and the coating units RESIST are arbitrarily set.

The first buffer unit BU1 includes a feed unit SN5, a return unit RT5, and a transfer unit PS5 provided between the blocks, as shown in FIG. 18. The second buffer unit BU2 also includes a feed unit SN6, a return unit RT6, and a transfer unit PS6 provided between the blocks. Each of the two feed units SN5, SN6 includes five substrate platforms 31. Each of the two return units RT5, RT6 includes five substrate platforms 31. Each of the transfer units PS5, PS6 has five substrate platforms 31.

(3) Operation of Substrate Treating Apparatus 1

Figure 19:
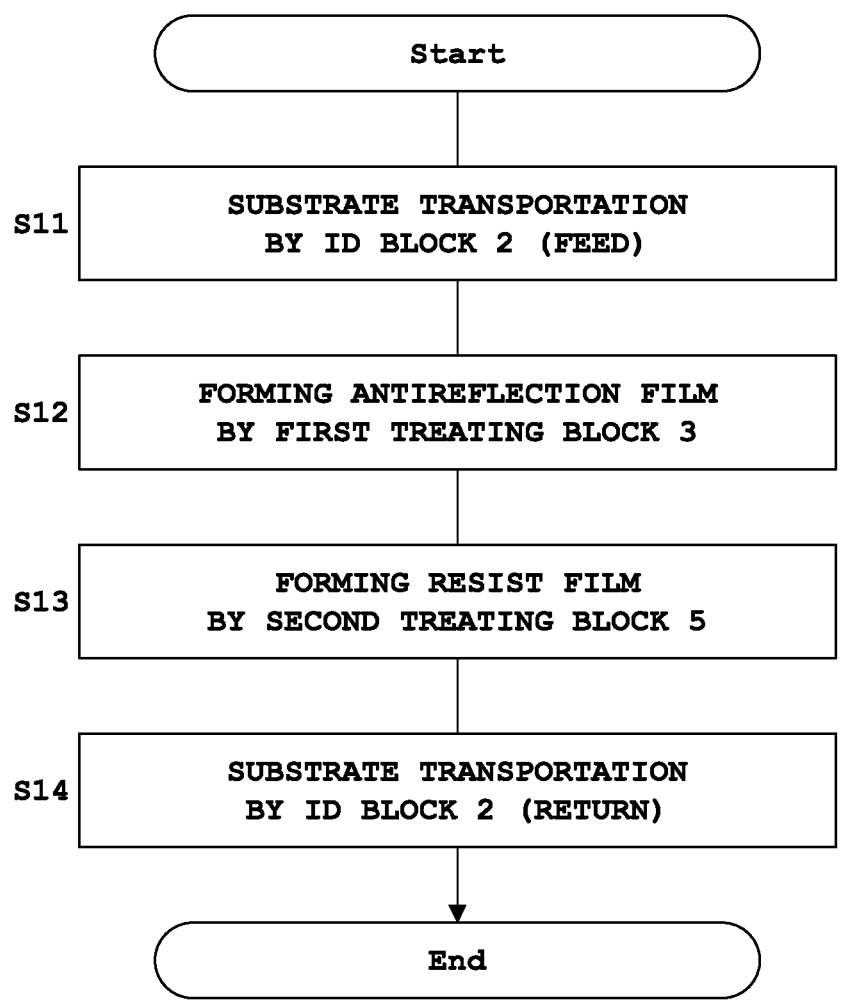
FIG. 19 is a flowchart illustrating operation of the substrate treating apparatus according to the second embodiment.

The following describes operation of the substrate treating apparatus 1. For example, the carrier C is transported to the platform 16 of the opener 11. FIG. 19 is a flowchart illustrating the operation of the substrate treating apparatus 1 according to the second embodiment.

[Step S11] Substrate Transportation by ID Block 2 (Feed)

The ID block 2 takes a substrate W from a carrier C placed on the platform 16 of the opener 11, and enables the first treating block 3 (each of the treatment layers A1, A2) to receive the substrate W. Here, the substrate W taken from the carrier C is treated in the treatment layer A1. Therefore, the substrate transport mechanism MHU1 transports the substrate W from the carrier C to the feed unit SN5 of the buffer unit BU1, for example. When the treatment layer A2 treats the substrate W, the substrate transport mechanism MHU1 transports the substrate W from the carrier C to the feed unit SN6 of the buffer unit BU2.

[Step S12] Forming Antireflection Film by First Treating Block 3

In the first treating block 3, the third substrate transport mechanism MHU3 of the treatment layer A1 receives the substrate W from the feed unit SN5. Thereafter, the substrate transport mechanism MHU3 transports the received substrate W to the cooling unit CP, the coating unit BARC, and the heating/cooling unit PHP in this order. Thereafter, the substrate transport mechanism MHU3 transports the substrate W on which an antireflection film is formed by the coating unit BARC to the transfer unit PS5 of the buffer unit BU1.

When the treatment layer A2 treats the substrate W, the third substrate transport mechanism MHU3 of the treatment layer A2 receives the substrate W from the feed unit SN6. Thereafter, the substrate transport mechanism MHU3 transports the received substrate W to the cooling unit CP, the coating unit BARC, and the heating/cooling unit PHP in this order. Thereafter, the substrate transport mechanism MHU3 transports the substrate W on which an antireflection film is formed by the coating unit BARC to the transfer unit PS6 of the buffer unit BU2.

[Step S13] Forming Resist Film by Second Treating Block 5

In the second treating block 5, the substrate transport mechanism MHU4 of the treatment layer B1 receives the substrate W from the transfer unit PS5. The received substrate W is a substrate W placed on the transfer unit PS5 by the substrate transport mechanism MHU3 of the treatment layer A1. The transportation of the substrate W from the treatment layer A1 to the treatment layer B1 is performed without using the two substrate transport mechanisms MHU1, MHU2 of the ID block 2. Thereafter, the substrate transport mechanism MHU4 of the treatment layer B1 transports the substrate W on which an antireflection film is formed to the cooling unit CP, the coating unit RESIST, and the heating/cooling unit PHP in this order. Thereafter, the substrate transport mechanism MHU4 of the treatment layer B1 transports the substrate W on which a resist film is formed by the coating unit RESIST to the return unit RT5 of the first buffer unit BU1.

Here, it is assumed that the third substrate transport mechanism MHU3 of the treatment layer A2 places the substrate W on the transfer unit PS6 of the second buffer unit BU2. In this case, the substrate transport mechanism MHU4 of the treatment layer B2 receives the substrate W placed on the transfer unit PS6 from the transfer unit PS6. The transportation of the substrate W from the treatment layer A2 to the treatment layer B2 is performed without using the two substrate transport mechanisms MHU1, MHU2 of the ID block 2. Thereafter, the substrate transport mechanism MHU4 of the treatment layer B2 transports the substrate W on which an antireflection film is formed to the cooling unit CP, the coating unit RESIST, and the heating/cooling unit PHP in this order. Thereafter, the substrate transport mechanism MHU4 of the treatment layer B2 transports the substrate W on which a resist film is formed by the coating unit RESIST to the return unit RT6 of the second buffer unit BU2.

[Step S14] Substrate Transportation by ID Block 2 (Return)

The ID block 2 returns the substrate W transported from the second treating block 5 from the substrate buffer BF to the carrier C placed on the platform 16 of the opener 13.

Detailed description is as under. An empty carrier C accommodating substrates W under treatment is transported to the platform 16 of the opener 13, for example. The substrate transport mechanism MHU2 of the ID block 2 transports the treated substrate W from the return unit RT5 of the first buffer unit BU1 to the carrier C placed on the platform 16 of the opener 13. When the substrate W is treated in the treatment layers A2, B2, the substrate transport mechanism MHU2 transports the treated substrate W from the return unit RT6 of the second buffer unit BU2 to the carrier C placed on the platform 16 of one of the two openers 13, 14.

With this embodiment, the substrate W is treatable through the first treating block 3 and second treating block 5. The substrate W is treated in the two treating blocks 3, 5 mainly in the ID block 2. It is assumed that, as shown in FIG. 2, for example, the ID block 202, the first treating block 203 and the second treating block 205 are arranged in a row in this order. In this case, the substrate treated in the first treating block 203 and the second treating block 205 in this order necessarily pass through the first treating block 203 in order to return to the ID block 202. According to the present invention, since the second treating block 5 is directly connected to the ID block 2, the operation of passing a substrate W without treating in the first treating block 3 is omittable.

Further, when the substrate W is transported from the first treating block 3 to the second treating block 5, for example, the substrate can be transported from the first treating block 3 to the second treating block 5 through the substrate buffer BF (buffer units BU1, BU2) arranged in the middle of the two treating blocks 3, 5 without using the substrate transport mechanisms MHU1, MHU2. Therefore, the burden of the substrate transportation by the substrate transport mechanisms MHU1, MHU2 is reducible.

Third Embodiment

A third embodiment of the present invention will now be described with reference to the drawings. Here, the description common to that of the first and second embodiments is to be omitted.

The two buffer units BU1, BU2 are provided vertically. Each of the two buffer units BU1, BU2 may be configured to be detachable and attachable from and to the ID block 2.

(4) Configuration of Substrate Treating Apparatus 1

(4-1) Configuration for Detachment and Attachment of Buffer Unit BU1, BU2

Figure 20A:
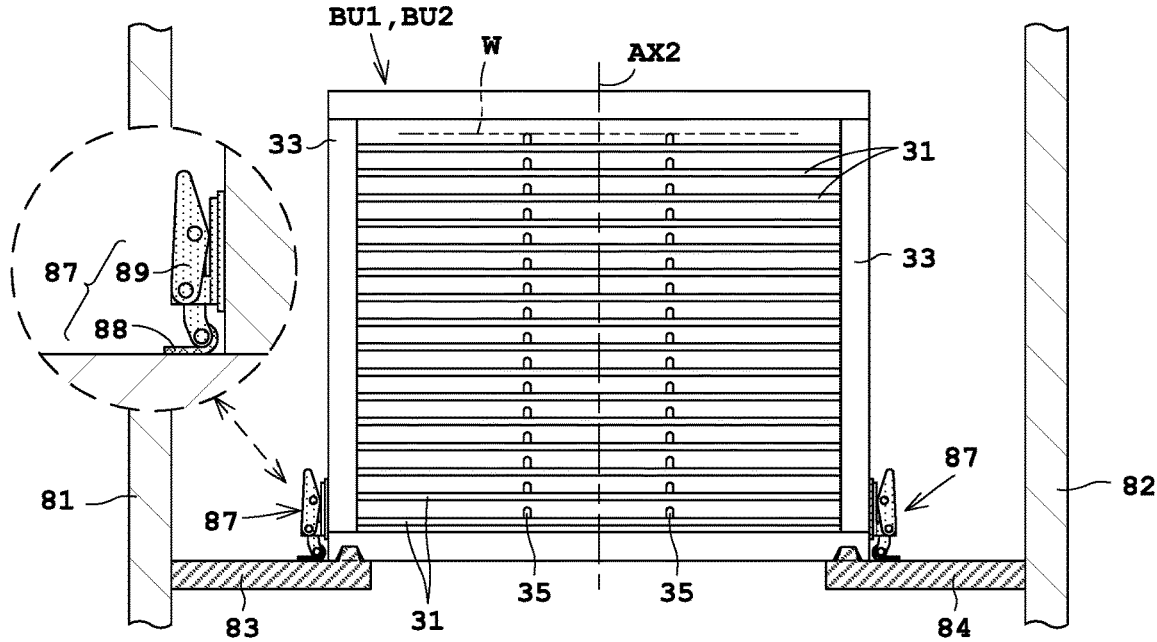
FIGS. 20A and 20B illustrate detaching and attaching of a buffer unit.
Figure 20B:
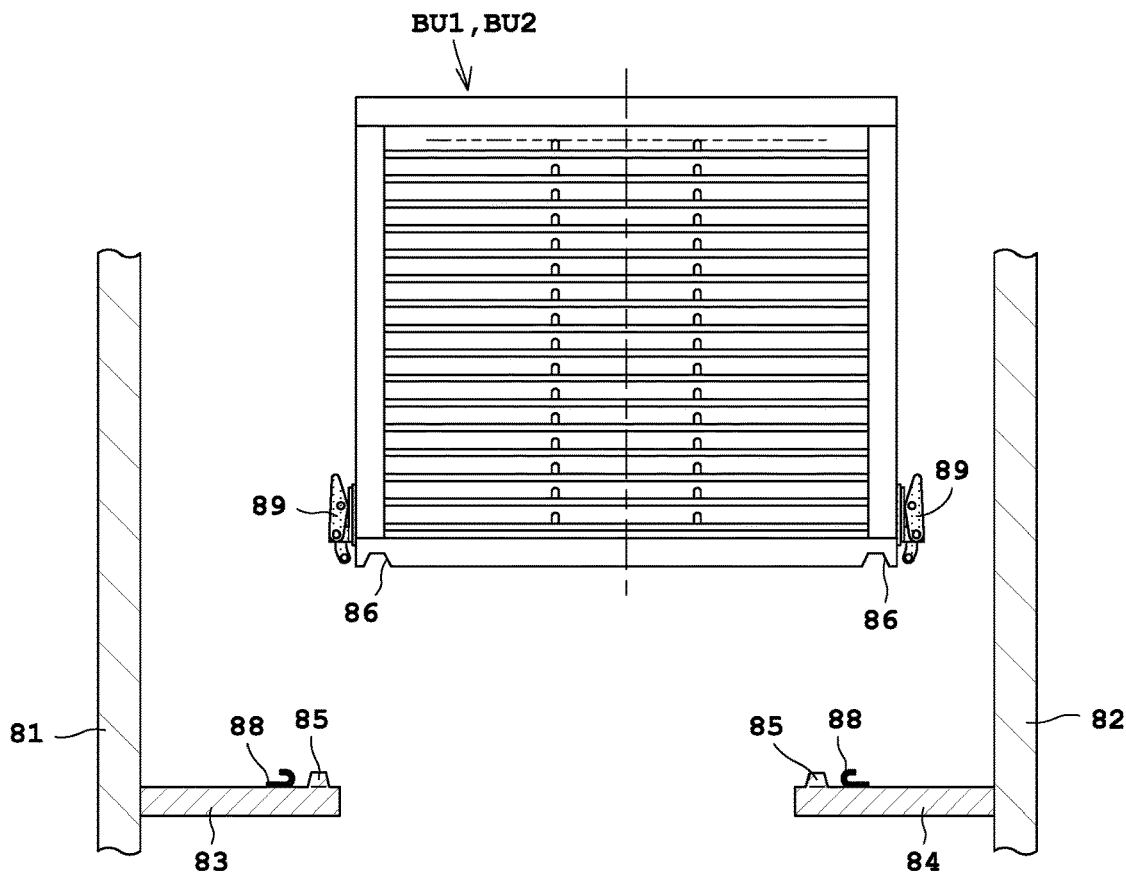

Reference is made to FIG. 20A. The ID block 2 includes frames 81, 82 as skeletons. The frame 81 is a frame adjacent to the first treating block 3. The frame 82 is a frame adjacent to the second treating block 5. A projecting support portion 83 projecting horizontally is provided on the frame 81. A projecting support portion 84 projecting horizontally is provided on the frame 82. Each of the buffer unit BU1, BU2 is arranged so as to extend between the projecting support portions 83, 84. Convex portions 85 protruding upward (see FIG. 20B) are provided on a tip of each of the projecting support portions 83, 84. Recess portions 86 (see FIG. 20B) are provided on the bottom surface of each of the buffer units BU1, BU2. The convex portions 85 and the recess portions 86 are used to position the buffer units BU1, BU2.

As shown in FIG. 20A, the buffer units BU1, BU2 are attached to the two projecting support portions 83, 84, respectively, with fasteners such as four draw latches 87. The draw latches 87 each include a receiving member 88 and a hook movable portion 89. The receiving member 88 is provided on each of the projecting support portions 83, 84. The hook movable portion 89 is provided on each of the buffer units BU1, BU2. The hook movable portions 89 may be provided on the projecting support portions 83, 84, and the receiving members 88 may be provided on the buffer units BU1, BU2.

For example, in the buffer unit BU1 shown in FIG. 20A, a hook of the hook movable portion 89 is hooked with the receiving member 88 by operating a lever of the hook movable portion 89. At the same time, the buffer unit BU1 is pressed against, for example, the projecting support portion 83 to maintain this hooked and pressed state. Such operation is performed to all the draw latches 87, whereby the buffer unit BU1 is attached to the projecting support portions 83, 84. Moreover, the maintained hooked and pressed state is released by operating the levers of the hook movable portions 89 with all the draw latches 87. Thus, the buffer unit BU1 is detached from the projecting support portions 83, 84. The second buffer unit BU2 is also attached and detached in a same manner as that of the first buffer unit BU1.

In the above description, four draw latches 87 are provided to attach the buffer units BU1, BU2. However, it is only necessary to provide two or more draw latches 87. Further, the projecting support portion 83 may be attached to the frame of the first treating block 3, and the projecting support portion 84 may be attached to the frame of the second treating block 5.

(4-2) Arrangement of Support Pins

Figure 21A:
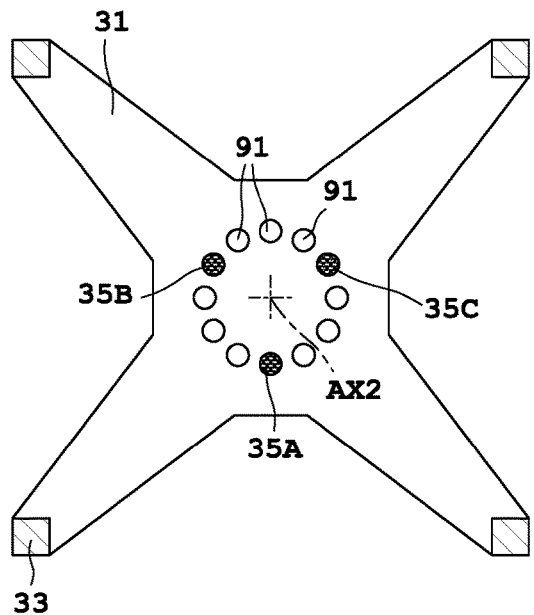
FIGS. 21A to 21D illustrate an arrangement of three support pins in a substrate platform.

Reference is made to FIG. 21A. The substrate platform 31 includes three support pins 35 attached thereto. The three support pins 35 are disposed around the vertical axis AX2. Further, the three support pins 35 are configured to be attachable and detachable to and from the substrate platform 31 by operating from a lower surface 31R of the substrate platform 31 with an L-shaped tool TL such as a hexagonal wrench (see FIG. 22A). In FIG. 21A, twelve holes 91 are formed in the substrate platform 31 in a ring shape at equal intervals around the vertical axis AX2. The number of holes 91 is arbitrarily set.

Figure 22A:
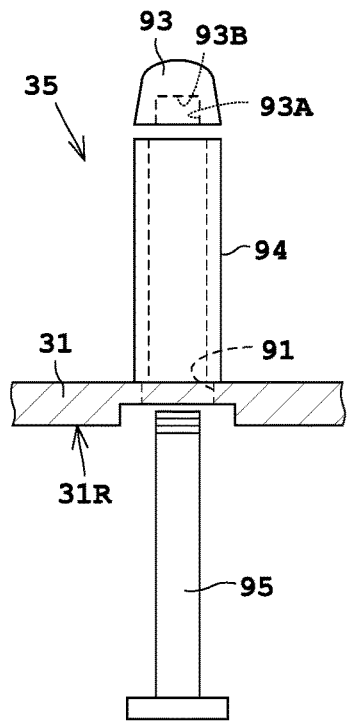
FIGS. 22A to 22D illustrate support pins.
Figure 22B:
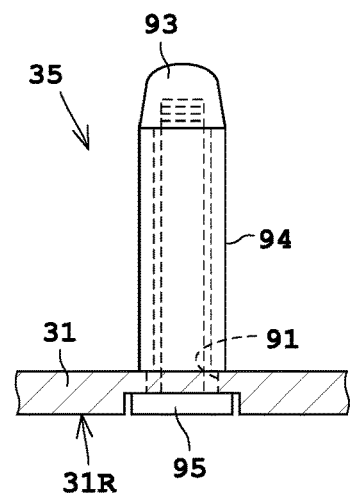

As shown in FIG. 22A, the support pin 35 includes a cap 93, a shaft (spacer) 94 and a male screw 95. A hole portion 93B with a female screw 93A is formed on the back side of the cap 93. The shaft 94 is made into a tubular. The male screw 95 is inserted from the lower surface 31R of the substrate platform 31 through the hole portion 91 and the shaft 94. Thereafter, the male screw 95 is screwed into the cap 93 while being inserted through the hole portion 93B of the cap 93. A threaded portion of the tip of the male screw 95 engages with the female screw 93A. Screw fastening is performed with an L-shaped tool TL such as a hexagonal wrench. FIG. 22B shows the support pin 35 attached to the substrate platform 31.

Figure 21B:
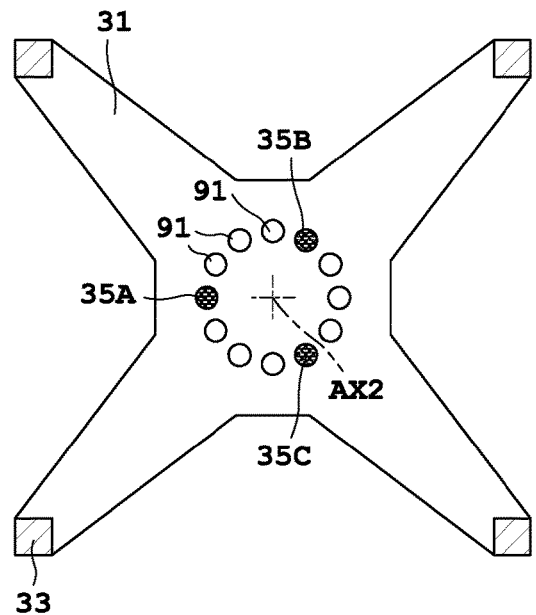
Figure 21C:
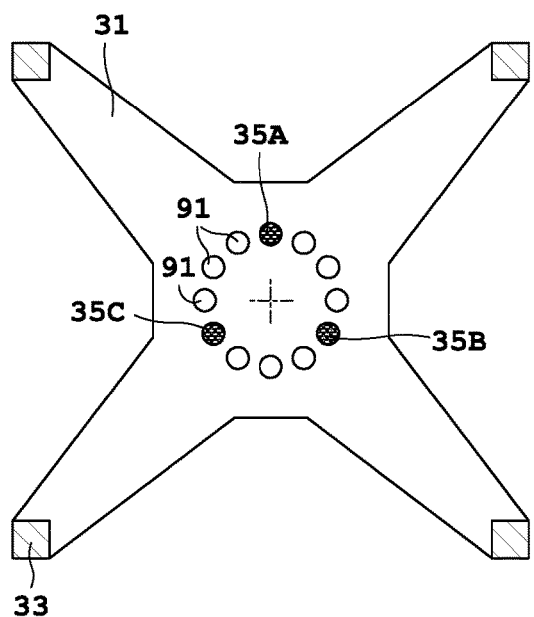
Figure 21D:
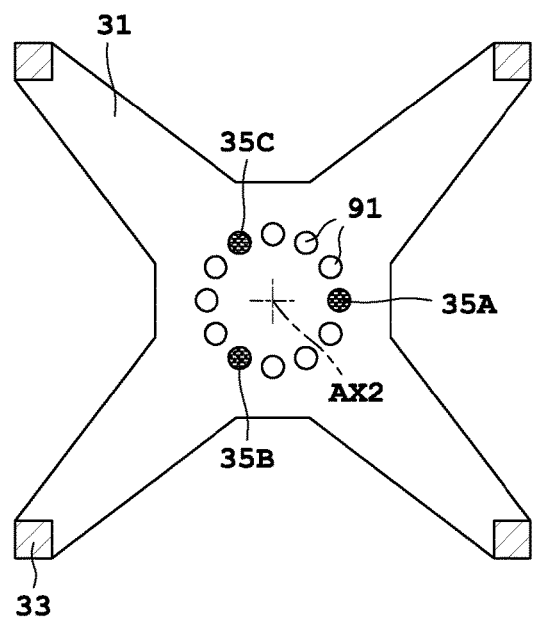

Reference is made to FIG. 21A. For example, in the lowermost stage (first stage) of the substrate platform 31, a predetermined support pin 35A is disposed on the lower side. When directions are represented with the clock hand's position, the support pin 35A is disposed toward six o'clock from the vertical axis AX2. Other support pins 35B, 35C are spaced apart by 120 degrees. Reference is made to FIG. 21B. In the substrate platform 31 of the second stage (one stage above the first stage), the support pin 35A is disposed on the left side (at nine o'clock). Reference is made to FIG. 21C. In the substrate platform 31 of the third stage (one stage above the second stage), the support pin 35A is disposed on the upper side (at twelve o'clock). Reference is made to FIG. 21D. In the substrate platform 31 of the fourth stage (one stage above the third stage), the support pin 35A is disposed on the right side (at three o'clock). In FIGS. 21A to 21D, since the three support pins 35A to 35C are arranged at 90 degree increment per stage, the support pins 35A are arranged in a spiral shape, for example.

That is, the three support pins 35 of each of the substrate platforms 31 are arranged so as not to overlap the three support pins 35 of each of the substrate platforms 31 immediately above and below in plan view. Specifically, the three support pins 35 of each of the substrate platforms 31 are spaced at a preset angle (90 degrees) about the vertical axis AX2 relative to the three support pins 35 of each of the substrate platforms 31 immediately above or below. The three support pins 35 of the substrate platforms 31 in the uppermost stage are displaced relative to the three support pins 35 of the substrate platform 31 immediately below. The three support pins 35 of the substrate platforms 31 in the lowermost stage are displaced relative to the three support pins 35 of the substrate platform 31 immediately above.

The preset angle is not limited to 90 degrees. For example, the preset angle may be 30 degrees, 60 degrees, or 180 degrees. However, if the three support pins 35 are spaced at intervals of 120 degrees, the preset angle may not be 120 degrees, 240 degrees, or 360 degrees.

Figure 22C:
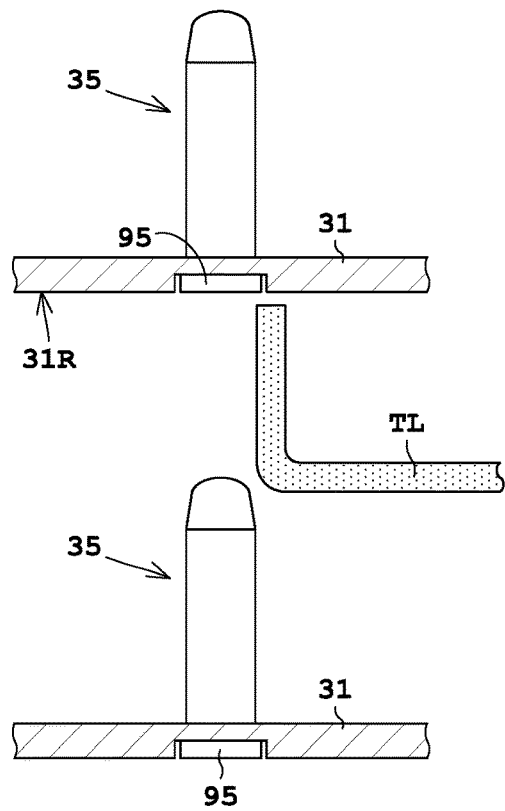
Figure 22D:
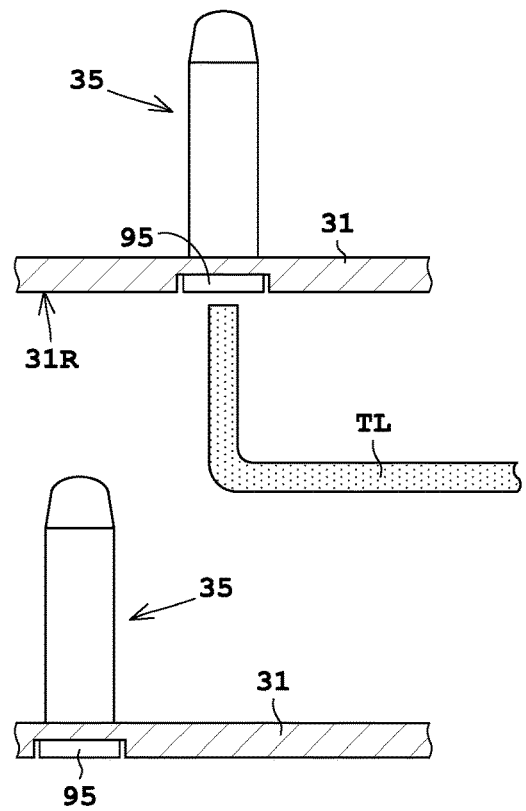

If the two support pins 35 overlap in plan view as in FIG. 22C, the tool may touch the lower support pin 35 in attaching and detaching the upper support pin 35. In contrast to this, if the two support pins 35 do not overlap in plan view, as shown in FIG. 22D, the possibility that the tool will touch the lower support pin 35 is reduced in attaching and detaching the upper support pin 35. Accordingly, this makes it easy to attach and detach the support pins 35. Therefore, enhanced maintainability of the buffer units BU1, BU2 is obtainable. Moreover, since the substrate platform 31 is formed in an X-shape, an operator is able to access the support pins 35 disposed near the center of the substrate platform 31 easily.

(5) Maintenance Method for Substrate Treating Apparatus 1

Next, a maintenance method for the substrate treating apparatus 1 will be described. Especially, the operation of detaching the buffer units BU1, BU2 from the substrate treating apparatus 1 will be described.

[Step S21] Upward Moving of Two Hands 21 and Forward/Rearward Driving Unit 23

In FIG. 3, the two hands 21 and the forward/rearward driving unit 23 of each of the two substrate transport mechanisms MHU1, MHU2 are moved upward to an unobstructed position. This allows the operator to enter the ID block 2 after removing the outer wall 97 (see FIG. 4) of the ID block 2. Then, the operator can access the two buffer units BU1, BU2 arranged at the center of the ID block 2 from the side of the strut portions 25A of the substrate transport mechanisms MHU1, MHU2.

[Step S22] Detaching Buffer Units BU1, BU2

In the condition of FIG. 20A, the operator releases the fixing of the buffer unit BU1, for example, from the projecting support portions 83, 84 by operating the draw latches 87. This allows the operator to carry the buffer unit BU1. When the buffer unit BU1 is carried out from the substrate treating apparatus 1, a lateral space adjacent to the strut portions 25A of the substrate transport mechanisms MHU1, MHU2 may be made so that the substrate W and the substrate platform 31 can be transported in a horizontal position.

The buffer units BU1, BU2 are individually configured to be detachable and attachable from and to the projecting support portions 83, 84 (i.e., the substrate treating apparatus 1). As a result, the two buffer units BU1, BU2 can be transported separately, leading to easy transportation of the two buffer units BU1, BU2. In addition, since the substrate platform 31 is formed in an X-shape, reduction in weight of the buffer units BU1, BU2 is obtainable.

If each of the buffer units BU1, BU2 is attached to the projecting support portions 83, 84 (i.e., the substrate treating apparatus 1), steps S21, S22 are performed in the reverse procedure. That is, the two buffer units BU1, BU2 are each attached to the projecting support portions 83, 84. Thereafter, the operator exits from the ID block 2 and performs an operation such as returning the two hands 21 and the forward/rearward driving unit 23 of each of the two substrate transport mechanisms MHU1, MHU2 to predetermined positions.

With this embodiment, the two treating blocks 3, 5 include the two treatment layers A1, A2 (or B1, B2) arranged to be stacked. The substrate buffer BF includes the two buffer units BU1, BU2 provided corresponding to the two levels of the treatment layers A1, A2, for example. Each of the buffer units BU1, BU2 is configured to be detachable and attachable from and to the ID block 2. That is, the substrate buffer BF includes the two buffer units BU1, BU2. Each of the buffer units BU1, BU2 is configured to be detachable and attachable individually. Therefore, since the buffer units BU1, BU2 are transportable individually, the substrate buffer BF can be easily transported.

Fourth Embodiment

A fourth embodiment of the present invention will now be described with reference to the drawings. Here, the description common to that of the first to third embodiments is to be omitted.

In the first embodiment, the carrier buffer device 8 is mounted on the first treating block 3, the ID block 2, and second treating block 5, as shown in FIG. 3. In this regard, in the fourth embodiment, a carrier buffer device 101 is mounted on the second treating block 5 lower than the height of the first treating block 3, as shown in FIG. 23.

(6) Configuration of Substrate Treating Apparatus 1

(6-1) ID Block 2

Figure 23:
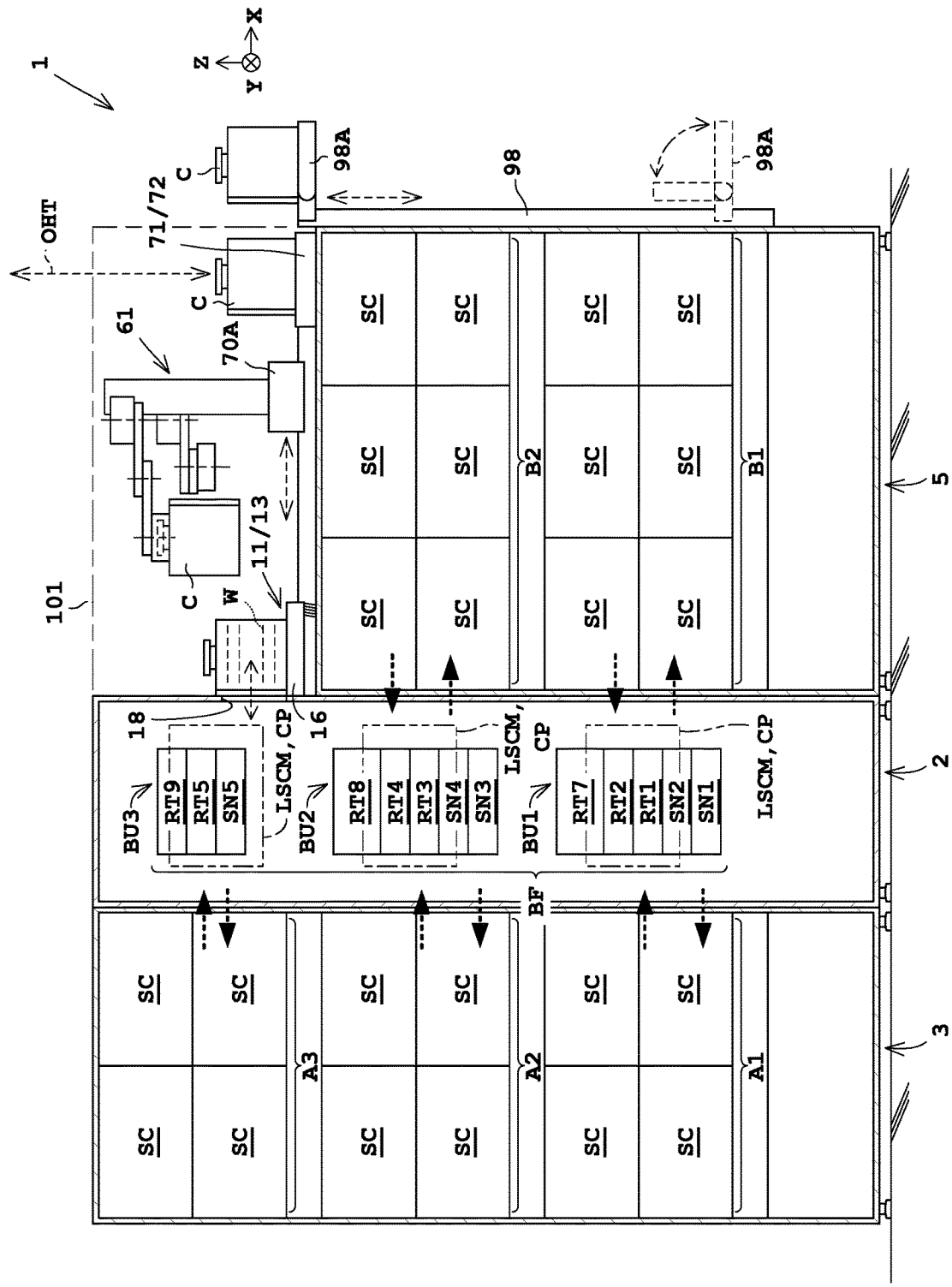
FIG. 23 is a right side view of a substrate treating apparatus according to a fourth embodiment.
Figure 24:
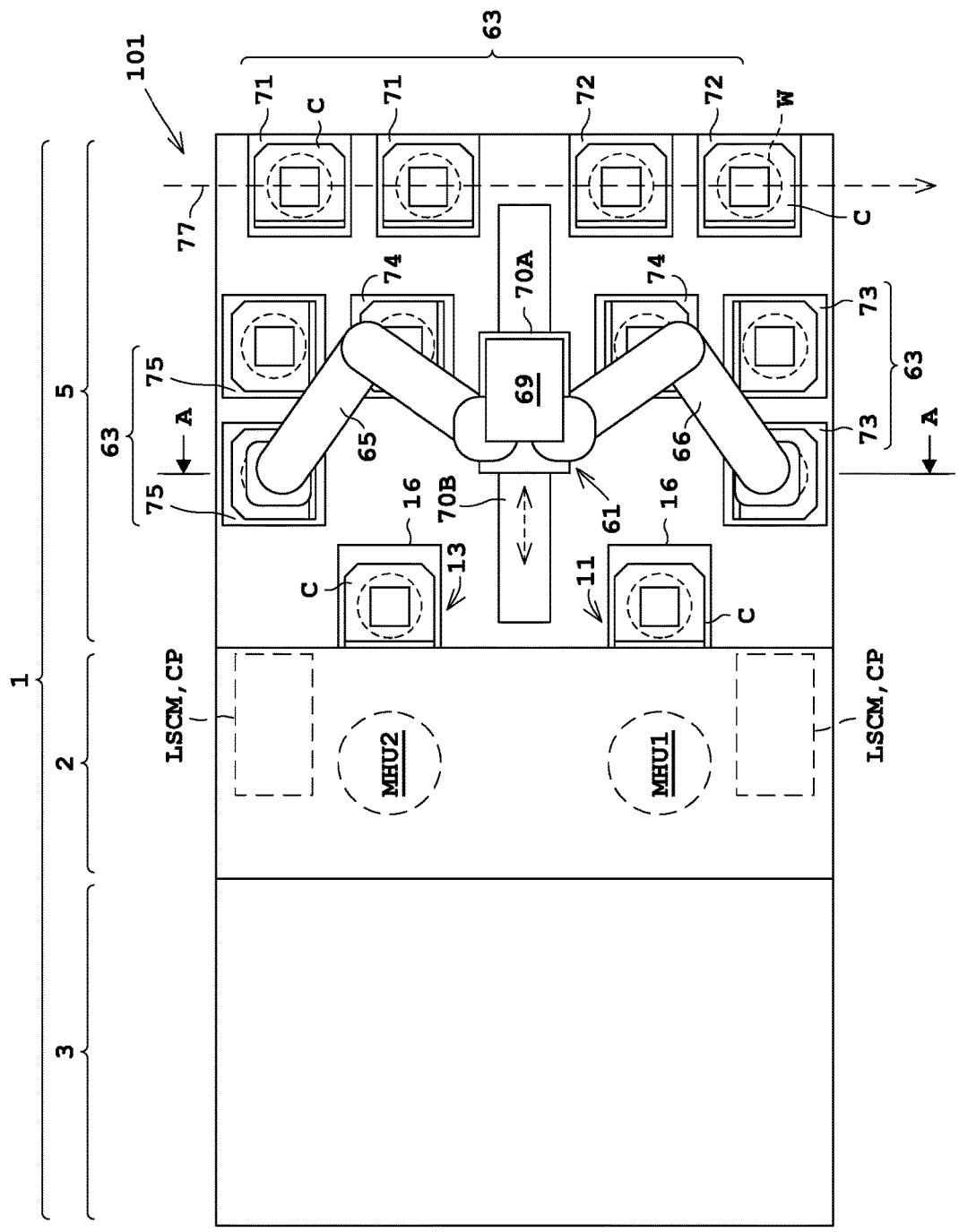
FIG. 24 is a plan view of the substrate treating apparatus according to the fourth embodiment.

Reference is made to FIGS. 23 and 24. The ID block 2 includes two openers 11, 13. The two openers 11, 13 are provided on the outer wall adjacent to the carrier buffer device 101. Each of the two openers 11, 13 includes a platform 16 or the like.

Similar to the ID block 2 of the first embodiment, the ID block 2 includes two substrate transport mechanisms MHU1, MHU2 and a substrate buffer BF. The substrate buffer BF includes three buffer units BU1 to BU3 arranged in the vertical direction. The buffer unit BU1 includes two feed units SN1, SN2 and three return units RT1, RT2, RT7. The buffer unit BU2 includes two feed units SN3, SN4 and three return units RT3, RT4, RT8. The buffer unit BU3 includes a feed unit SN5 and two return units RT5, RT9. The feed unit (e.g., reference numeral SN5) and the return unit (e.g., reference numeral RT9) are each configured to place a plurality of substrates W thereon.

Moreover, the ID block 2 includes cooling units CP and inspection units LSCM at the position indicated by dotted lines in FIG. 24. The cooling unit CP and the inspection unit LSCM are provided in the vicinity of at least either of the two substrate transport mechanisms MHU1, MHU2. One cooling unit CP and one inspection unit LSCM are provided in each of the three buffer units BU1 to BU3. The cooling units CP and the inspection units LSCM are provided in the same level as each of the three buffer units BU1 to BU3. The cooling units CP and the inspection units LSCM are provided so as not to interfere with the lifting/lowering rotation driving unit 25 or the like shown in FIG. 4.

The cooling units CP cool the substrates W. The cooling unit CP includes a plate 55 and a water-cooled circulation mechanism, for example. The inspection unit LSCM inspects the coated substrate W using a CCD camera or an image sensor. The inspection unit LSCM includes a CCD camera or an image sensor, and the control unit (e.g., CPU) for executing an inspection program. Note that the cooling units CP and the inspection units LSCM may be provided in each of the five treatment layers A1 to A3, B1, and B2, which will be described later, instead of the ID block 2. In this case, the three return units RT7, RT8, RT9 need not be provided.

(6-2) Configuration of Treating Block 3, 5

Reference is made to FIG. 23. The first treating block 3 includes three treatment layers A1 to A3. On the other hand, the second treating block 5 includes two treatment layers B1, B2. The treatment layer A1 is arranged in the same level (first floor) as the treatment layer B1 and the buffer unit BU1. The treatment layer A2 is arranged in the same level (second floor) as the treatment layer B2 and the buffer unit BU2. The treatment layer A3 is disposed in the same level (third floor) as the carrier buffer device 101 and the buffer unit BU3.

Each of the treatment layers A1 to A3 in the first treating block 3 performs a coating treatment as the first treatment, for example. Each of the treatment layers B1, B2 in the second treating block 5 performs a coating treatment, for example. That is, each of the treatment layers A1 to A3 performs the same treatment as each of the treatment layers B1, B2. Therefore, the five treatment layers A1 to A3, B1, and B2 perform the coating treatment in parallel. Similar to the treatment layer A1 in the first embodiment, for example, each of the three treatment layers A1 to A3 includes a third substrate transport mechanism MHU3, a plurality of coating units SC, a plurality of heat-treatment units 37, and a transportation space 39. Similar to the treatment layer B1 in the first embodiment, for example, each of the two treatment layers B1, B2 includes a fourth substrate transport mechanism MHU4, a plurality of coating units SC, a plurality of heat-treatment units 37, and a transportation space 39. Detailed description of these will be omitted.

(6-3) Configuration of Carrier Buffer Device 101

The carrier buffer device 101 (the carrier storage shelf 63 and the carrier transport mechanism 61) is mounted on the lower of the first treating block 3 and second treating block 5. As shown in FIG. 23, the height of the second treating block 5 is lower than that of the first treating block 3. Therefore, the carrier buffer device 101 is mounted on the second treating block 5. Moreover, as in FIG. 23, the carrier buffer device 101 is disposed in the same level as the uppermost treatment layer A3 of the first treating block 3.

The height of the second treating block 5 and that of the carrier buffer device 101 is preferably within the height of the first treating block 3 (the higher block). Likewise, the height of the ID block 2 is preferably within the height of the second treating block 5.

Reference is made to FIG. 24. Similar to the carrier buffer device 8 in the first embodiment, the carrier buffer device 8 includes a carrier transport mechanism 61, and carrier storage shelves 63 as shown in FIGS. 1 and 8. The carrier transport mechanism 61 transports carriers C between the platform 16 of each of the two openers 11, 13 and the carrier storage shelf 63. The carrier storage shelves 63 include input ports 71, output ports 72, untreated substrate carrier shelves 73, empty carrier shelves 74, and treated substrate carrier shelves 75. The type and number of the carrier storage shelves 63 (shelves 71 to 75) are variable appropriately.

(7) Operation of Substrate Treating Apparatus 1

The following describes the operation of the substrate treating apparatus 1 of this embodiment with reference to FIG. 23. The operations in steps S31 to S33 in this embodiment are made in a similar manner to those in steps S01 to S03 shown in FIG. 15. The opener 11 is used to take a substrate W from a carrier C. The opener 13 is used to return the substrate W to the carrier C. Each of the five treatment layers A1 to A3, B1, and B2 performs a coating treatment of a photoresist liquid, for example.

[Step S31] Substrate Transportation by ID Block 2 (Feed)

The external transport mechanism OHT transports a carrier C to the input port 71. The carrier transport mechanism 61 transports the carrier C from the input ports 71 to the platform 16 of the opener 11. The substrate transport mechanism MHU1 of the ID block 2 takes a substrate W from the carrier C of the opener 11, and transports the taken substrate W to the substrate buffer BF. For example, it is assumed that the substrate W is treated in the treatment layer A1. The first substrate transport mechanism MHU1 transports the taken substrate W to the feed unit SN1 of the buffer unit BU1.

If up to five treatment layers A1 to A3, B1, and B2 share substrates W accommodated in one carrier C to treat them in parallel, the substrates W can be treated at a speed up to five times faster than that at which the substrates W are treated in one treatment layer.

[Step S32] Substrate Treatment by Treating Block 3, 5

The third substrate transport mechanism MHU3 of the treatment layer A1 (see FIG. 4) receives the substrate W from the feed unit SN1 of the buffer unit BU1, and transports the received substrate W to the coating unit SC and any heat-treatment unit 37 (including any cooling unit CP). Thereafter, the third substrate transport mechanism MHU3 transports the substrate W on which a photoresist film is formed by the coating unit SC to the return unit RT1 of the buffer unit BU1, for example.

The feed unit SN2 and the return unit RT2 are used for the treatment layer B1. The feed unit SN3 and the return unit RT3 are used for the treatment layer A2. The feed unit SN4 and the return unit RT4 are used for the treatment layer B2. The feed unit SN5 and the return unit RT5 are used for the treatment layer A3.

[Step S33] Substrate Transportation by ID Block 2 (Return)

One of the two substrate transport mechanisms MHU1, MHU2 receives the substrate W on which a photoresist film is formed from the return unit RT1 of the buffer unit BU1, and transports the received substrate W to the cooling unit CP and the inspection unit LSCM in this order in the same level (first floor) as the buffer unit BU1. In this substrate transportation, the first substrate transport mechanism MHU1 transports substrates W to the cooling unit CP and the inspection unit LSCM adjacent to the first substrate transport mechanism MHU1. The second substrate transport mechanism MHU2 transports substrates W to the cooling unit CP and the inspection unit LSCM adjacent to the second substrate transport mechanism MHU2. The substrates W inspected by the inspection unit LSCM are transported to the return unit RT7 by one of the two substrate transport mechanisms MHU1, MHU2.

The substrates W transported to the two return units RT1, RT2 of the buffer unit BU1 are transported to the return unit RT7 after an inspection. The substrates W transported to the two return units RT3, RT4 of the buffer unit BU2 are transported to the return unit RT8 after an inspection. The substrates W transported to the return unit RT5 of the buffer unit BU3 are transported to the return unit RT9 after an inspection.

Moreover, in the ID block 2, the cooling unit CP and the inspection unit LSCM are provided in each of the three levels. Accordingly, they do not need to be provided in the treating blocks 3, 5. This achieves reduction in transportation steps by the substrate transport mechanisms MHU3, MHU4, leading to enhanced transporting performance. Further, the number of inspection units LSCM to be installed is reducible, reading to less calibration operations between the inspection units LSCM. Moreover, in the treating blocks 3, 5, the number of heat-treatment units 37 other than the units related to the inspection units LSCM can be increased. Accordingly, increase in throughput is obtainable. In addition, since two substrate transport mechanisms MHU1, MHU2 are able to take substrates W with respect to the return unit RT1, for example, at least two inspection units LSCM on both sides are capable of inspecting the substrates in parallel. Moreover, since the cooling units CP and inspection sections LSCM in other levels can be used as required, a cooling unit CP and an inspection section LSCM in any of the three levels can be selected.

After the inspection of a substrate W by the inspection unit LSCM, the second substrate transport mechanism MHU2 receives the substrate W subjected to the inspection from one of the return units RT7, RT8, and RT9 of the buffer units BU1, BU2, and BU3, and returns the received substrate W to the carrier C placed on the opener 16 of the opener 13. After all treated substrates W are accommodated in the carrier C, the carrier transport mechanism 61 transports the carrier C from the platform 16 of the opener 13 to the output port 72. The external transport mechanism OHT transports the carrier C from the output port 72.

With this embodiment, the carrier storage shelf 63 and the carrier transport mechanism 61 are provided horizontally with respect to the ID block 2 and the two treating blocks 3, 5, the footprint of the substrate treating apparatus 1 is increased accordingly. In this regard, the carrier storage shelf 63 and the carrier transport mechanism 61 are arranged so as to overlap one of the two treating blocks 3, 5 (second treating block 5 in FIG. 24) in plan view. As a result, suppressed increase in footprint of the substrate treating apparatus 1 is obtainable. This enables the substrate treating apparatus 1 to fit in a limited footprint. Also, the carrier storage shelf 63 and the carrier transport mechanism 61 are mounted on the lower block of the first treating block 3 and the second treating block 5 (second treating block 5 in FIG. 24). As a result, the height of the substrate treating apparatus 1 is suppressible.

In addition, in this embodiment, up to five parallel treatments can be performed with up to the five treatment layers A1 to A3, B1, and B2.

Figure 25A:
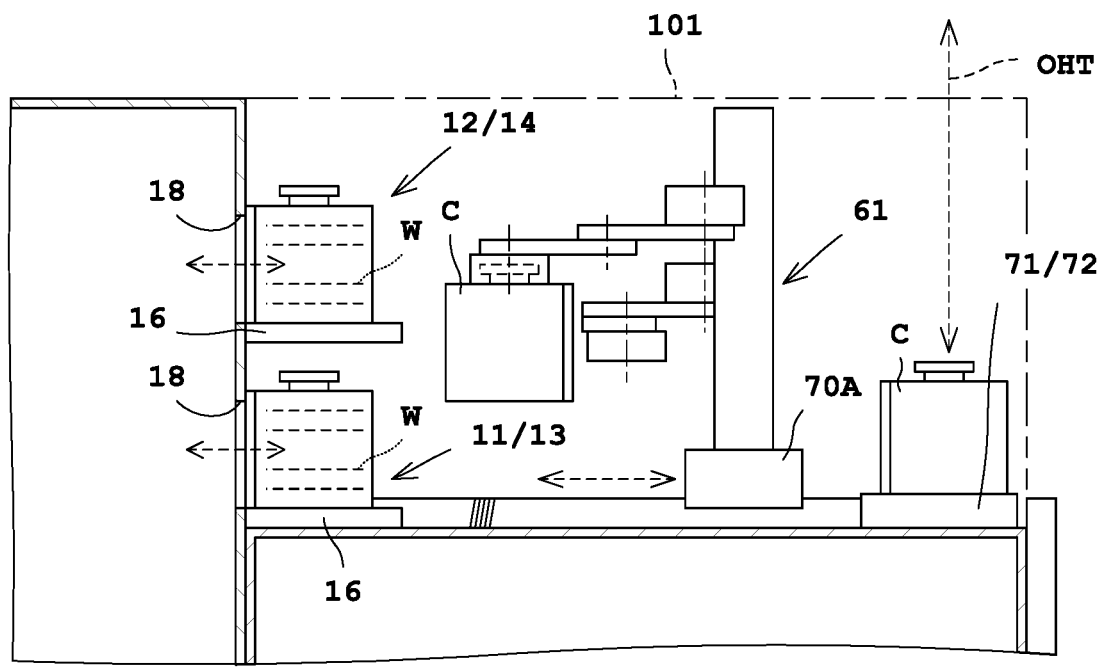
FIG. 25A illustrates two openers arranged vertically.

In this embodiment, the ID block 2 includes two openers 11, 13, as shown in FIG. 24. In this regard, four openers 11 to 14 may be provided in order to alternately take substrates W from two carriers C or to alternately accommodate substrates W in two carriers C. For example, two openers 11, 12 for taking substrates W are arranged vertically as shown in FIG. 25A. Moreover, the two openers 13, 14 for accommodating the substrate W are arranged vertically. That is, the two openers 11, 12 are arranged along the lifting/lowering direction of the hands 21 and the forward/rearward driving unit 23 of the first substrate transport mechanism MHU1. The two openers 13, 14 are arranged along the lifting/lowering direction of the hands 21 and the forward/rearward driving unit 23 of the second substrate transport mechanism MHU2.

Figure 25B:
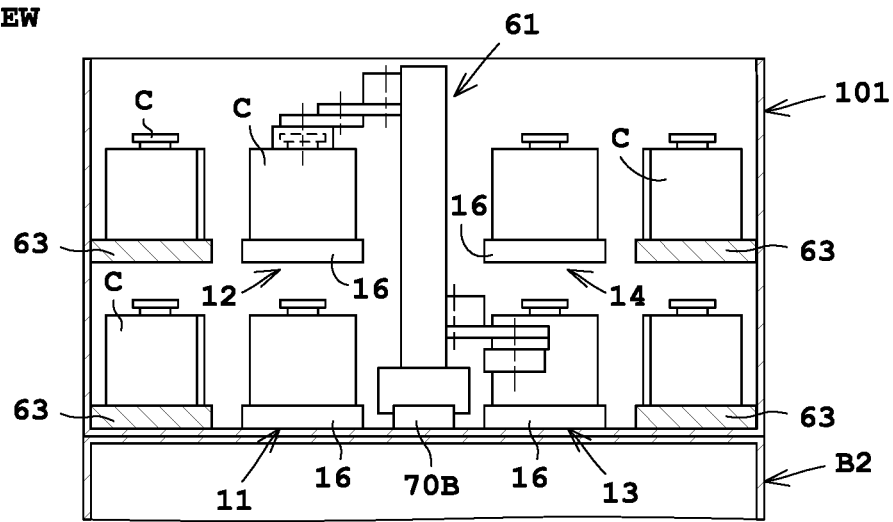
FIG. 25B illustrates carrier storage shelves each consisting of two stages as viewed from the line A-A of FIG. 24.

FIG. 25B is a diagram seen from A-A of FIG. 24. In FIG. 25B, the carrier storage shelf 63 may be constituted with two or more stages arranged vertically so that the carrier C can be stored in two or more stages. FIG. 25B illustrates the four openers 11 to 14 described in FIG. 25A. The sides of the carrier buffer device 101 of this embodiment may be surrounded by walls. Although each of the five treatment layers A1 to A3, B1, and B2 forms a photoresist film, other films (e.g., an antireflection film) may be formed. Each of the five treatment layers A1 to A3, B1, and B2 may perform a developing treatment or a cleaning treatment.

Fifth Embodiment

A fifth embodiment of the present invention will now be described with reference to the drawings. Here, the description common to that of the first to fourth embodiments is to be omitted.

In the fourth embodiment, the five treatment layers A1 to A3, B1, and B2 perform the same coating treatment. However, this is not limitative. In the fifth embodiment, the three treatment layers A1 to A3 of the first treating block 3 form a triple-layer film (an underlayer film, a middle film, and a photoresist film), for example. Moreover, the two treatment layers B1, B2 of the second treating block 5 form a double-layer film (a lower-layer film and a middle film), for example.

Figure 26:
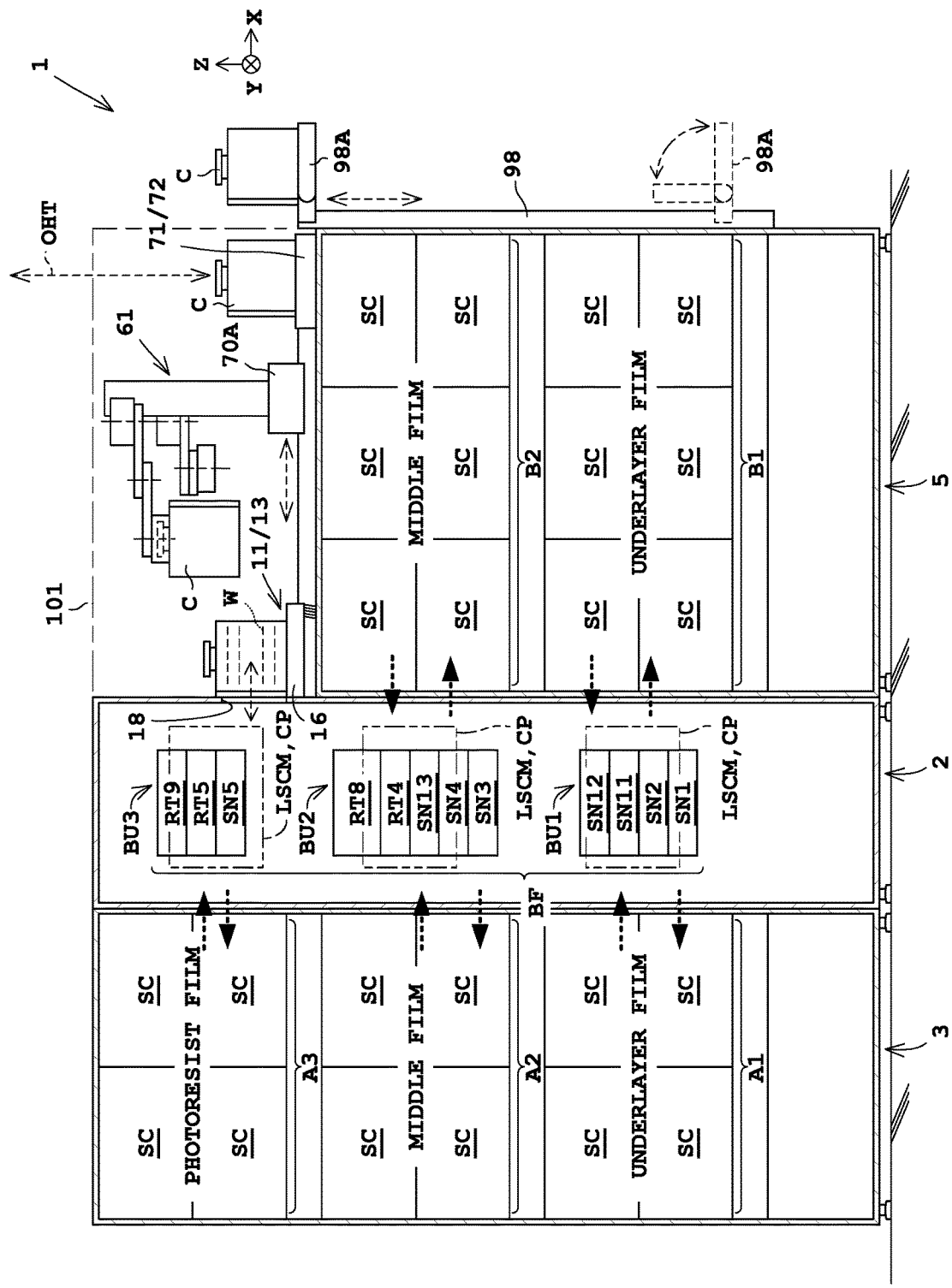
FIG. 26 is a right side view of the substrate treating apparatus according to the fifth embodiment.

Reference is made to FIG. 26. The first treating block 3 includes three treatment layers A1 to A3. Each the coating units SC of the first treatment layer A1 forms an underlayer film. Examples of the underlayer film include an SOC (spin-on carbon) film. Each the coating units SC of the second treatment layer A2 forms a middle film Examples of the middle film include an SOG (spin-on glass) film. Each the coating units SC (RESIST) of the third treatment layer A3 forms a photoresist film (top layer film) On the other hand, the second treating block 5 includes two treatment layers B1, B2. Each the coating units SC of the first treatment layer B1 forms an underlayer film Each the coating units SC of the second treatment layer B2 forms a middle layer.

(8) Operation of Substrate Treating Apparatus 1

Figure 27:
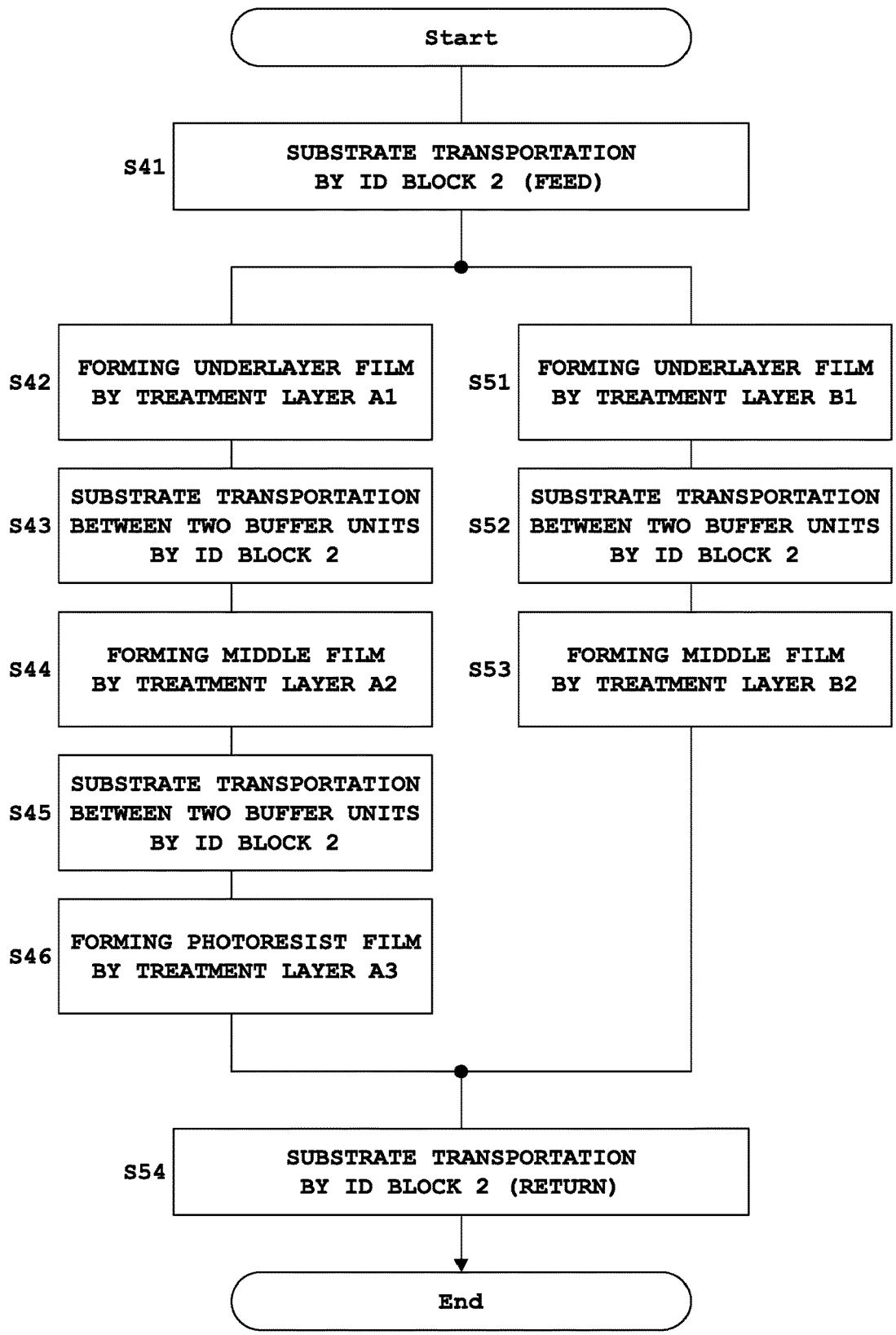
FIG. 27 is a flowchart illustrating operation of the substrate treating apparatus according to the fifth embodiment.

The following describes the operation of the substrate treating apparatus 1 of this embodiment with reference to FIG. 26. FIG. 27 is a flowchart illustrating the operation of the substrate treating apparatus according to the fifth embodiment.

[Step S41] Substrate Transportation by ID Block 2 (Feed)

The carriers C are transported to the platform 16 of the opener 11 by the carrier transport mechanism 61. The first substrate transport mechanism MHU1 takes the substrate W from the carrier C placed on the platform 16 of the opener 11. If the substrate W is treated in the first treating block 3, the taken substrate W is transported to the feed unit SN1 of the buffer unit BU1. In this case, the process proceeds to step S42. On the other hand, if the substrate W is treated in the second treating block 5, the taken substrate W is transported to the feed unit SN2 of the buffer unit BU1. In this case, the process proceeds to step S51.

[Step S42] Forming Underlayer Film by Treatment Layer A1

The operation from steps S42 to S46 in which the three treatment layers A1 to A3 of the first treating block 3 form triple-layer films (an underlayer film, a middle film and a photoresist film) on substrates W will be described. The substrate transport mechanism MHU3 of the treatment layer A1 receives the substrate W from the feed unit SN1 of the buffer unit BU1 and transports the received substrate W to the coating unit SC and any heat-treatment unit 37. Thereafter, the substrate transport mechanism MHU3 of the treatment layer A1 transports the substrate W on which an underlayer film is formed by the coating unit SC to the feed unit SN11 of the buffer unit BU1.

[Step S43] Substrate Transportation Between Two Buffer Units by ID Block 2

In the substrate buffer BF, the ID block 2 transports the substrate W on which an underlayer film is formed from the level of the treatment layer A1 to the level of the treatment layer A2. This enables the treatment layer A2 to receive the substrate W. Detailed description is as under. Either of the two substrate transport mechanisms MHU1, MHU2 receives a substrate W from the feed unit SN11 of the buffer unit BU1, and transports the received substrate W to the feed unit SN3 of the buffer unit BU2.

[Step S44] Forming Middle Film by Treatment Layer A2

The substrate transport mechanism MHU3 of the treatment layer A2 receives a substrate W from the feed unit SN3 of the buffer unit BU2, and transports the received substrate W to the coating unit SC and any heat-treatment unit 37. Thereafter, the substrate transport mechanism MHU3 of the treatment layer A2 transports the substrate W, on which a middle film formed by the coating unit SC, to the feed unit SN13 of the buffer unit BU2.

[Step S45] Substrate Transportation Between Two Buffer Units by ID Block 2

In the substrate buffer BF, the ID block 2 transports the substrate W, on which a middle film is formed from the level of the treatment layer A2, to the level of the treatment layer A3. This enables the treatment layer A3 to receive the substrate W. Detailed description is as under. Either of the two substrate transport mechanisms MHU1, MHU2 receives a substrate W from the feed unit SN13 of the buffer unit BU2, and transports the received substrate W to the feed unit SN5 of the buffer unit BU3.

[Step S46] Forming Photoresist Film by Treatment Layer A3

The substrate transport mechanism MHU3 of the treatment layer A3 receives a substrate W from the feed unit SN5 of the buffer unit BU3, and transports the received substrate W to the coating unit SC and any heat-treatment unit 37. Thereafter, the substrate transport mechanism MHU3 of the treatment layer A3 transports the substrate W, on which a photoresist film is formed by the coating unit SC, to the return unit RT5 of the buffer unit BU3. The process proceeds to step S54.

[Step S51] Forming Underlayer Film by Treatment Layer B1

From steps S51 to S53, the operation in which the two treatment layers B1, B2 of the second treating block 5 form the double-layer film (an underlayer film, and a middle film) on the substrate W will be described. The substrate transport mechanism MHU4 of the treatment layer B1 receives a substrate W from the feed unit SN2 of the buffer unit BU1, and transports the received substrate W to the coating unit SC and any heat-treatment unit 37. Thereafter, the substrate transport mechanism MHU4 of the treatment layer B1 transports the substrate W, on which an underlayer film is formed by the coating unit SC, to the feed unit SN12 of the buffer unit BU1.

[Step S52] Substrate Transportation Between Two Buffer Units by ID Block 2

In the substrate buffer BF, the ID block 2 transports the substrate W on which an underlayer film is formed from the level of the treatment layer B1 to the level of the treatment layer B2. This enables the treatment layer B2 to receive the substrate W. Detailed description is as under. One of the two substrate transport mechanisms MHU1, MHU2 receives a substrate W from the feed unit SN12 of the buffer unit BU1, and transports the received substrate W to the feed unit SN4 of the buffer unit BU2.

[Step S53] Forming Middle Film by Treatment Layer B2

The substrate transport mechanism MHU4 of the treatment layer B2 receives a substrate W from the feed unit SN4 of the buffer unit BU2, and transports the received substrate W to the coating unit SC and any heat-treatment unit 37. Thereafter, the substrate transport mechanism MHU4 of the treatment layer B2 transports the substrate W, on which a middle film is formed by the coating unit SC, to the return unit RT4 of the buffer unit BU2. The process proceeds to step S54.

[Step S54] Substrate Transportation by ID Block 2 (Return)

Either of the two substrate transport mechanisms MHU1, MHU2 receives the substrate W on which a middle film is formed from the return unit RT4 of the buffer unit BU2, and transports the received substrate W to the cooling unit CP and the inspection unit LSCM in this order in the same level (second floor) as the buffer unit BU2. After this inspection, either of the two substrate transport mechanisms MHU1, MHU2 transports the substrate W to the return unit RT8. Moreover, either of the two substrate transport mechanisms MHU1, MHU2 receives the substrate W on which a photoresist film is formed from the return unit RT5 of the buffer unit BU3, and transports the received substrate W to the cooling unit CP and the inspection unit LSCM in this order in the same level (third floor) as the buffer unit BU3. After this inspection, either of the two substrate transport mechanisms MHU1, MHU2 transports the substrate W to the return unit RT9.

After the inspection of the substrate W by the inspection unit LSCM, the second substrate transport mechanism MHU2 receives the substrate W, subjected to the inspection, from one of the return units RT8, RT9 of the buffer units BU2, BU3, and returns the received substrate W to the carrier C placed on the platform 16 of the opener 13. The carrier C accommodating the treated substrates W is transported from the opener 13 by the carrier transport mechanism 61.

This embodiment produces the same effect as that of the fourth embodiment. That is, an increase in the footprint of the substrate treating apparatus 1 is suppressible. This enables the substrate treating apparatus 1 to fit in a limited footprint. Moreover, the height of the substrate treating apparatus 1 is suppressible.

Further, in this embodiment, the first treating block 3 and the second treating block 5 enable different treatments from each other.

Here, it is assumed that there are two substrate treating apparatuses. A first substrate treating apparatus includes an ID block and a first treating block 3. A second substrate treating apparatus includes an ID block and a second treating block. In this case, an installation area for two substrate treating apparatuses is required for the two substrate treating apparatuses. In contrast to this, the two treating blocks 3, 5 in this embodiment share the ID block 2. Therefore, an installation area for one ID block is omitted, achieving reduction in footprint of the substrate treating apparatuses having two treating blocks 3, 5.

In this embodiment, the three treatment layers A1 to A3 of the first treating block 3 form a triple layers film, and the two treatment layers B1, B2 of the second treating block 5 form a double-layer film. However, the treatments by the two treating blocks 3, 5 are not limited thereto. For example, each of the two treatment layers B1, B2 of the second treating block 5 may form a resist film. In this case, the treatment layer B1 may form the same resist film as that by the treatment layer B2, for example, or may form another resist film. In this modification, the three treatment layers A1 to A3 perform treatment in series and the two treatment layers B1, B2 perform treatment in parallel.

Moreover, as in the second embodiment, the two treatment layers A1, B1 may form a double-layer film (an underlayer film and a middle film) on a substrate W. The remaining three treatment layers A3, A2, B2 may form a triple-layer film (an underlayer film, a middle film and a photoresist film) on a substrate W. In this case, after the treatment layer A3 forms an underlayer film, the treatment layer A2 forms a middle film, for example. Thereafter, the treatment layer B2 forms a photoresist film. When a substrate W is transported from the treatment layer A2 to the treatment layer B2, the substrate W is transported without using the two substrate transport mechanisms MHU1, MHU2, as in the second embodiment.

The present invention is not limited to the foregoing examples, but may be modified as follows.

(1) In the first to third embodiments described above, the two treating blocks 3, 5 each include the two treatment layers (e.g., treatment layers A1, A2). In this regard, the first treating block 3 may include one treatment layer or three or more treatment layers. Moreover, the second treating block 5 may include one treatment layer or three or more treatment layers. That is, at least either of the two treating blocks 3, 5 may include a plurality of the treatment layers arranged to be stacked.

(2) In the first to third embodiments and the modification (1) described above, no carrier storage shelf 63 is provided on the ID block 2 in FIG. 5. However, a carrier storage shelf 63 may be provided on the ID block 2.

(3) In the first to third embodiments and the modifications described above, the platforms 16 are disposed above both the first treating block 3 and the second treating block 5, as shown in FIG. 3. In this regard, the platforms 16 may be disposed on the upper surfaces of or above one of the first treating block 3 and second treating block 5. That is, the platforms 16 may be disposed on the upper surface of or above at least either the first treating block 3 or the second treating block 5.

As shown in FIG. 1, for example, if the platform 216 is placed on the side of the ID block 202, the footprint of the substrate treating apparatus 201 is increased according to an area of the platform 216. In this regard, with this embodiment, the platform 16 overlaps at least either of the first treating block 3 and the second treating block 5 in plan view. As a result, suppressed increase in footprint of the substrate treating apparatus 1 is obtainable.

(4) In the first to third embodiments and the modifications described above, a cooling unit CP and an inspection unit LSCM (at least an inspection unit LSCM) may be provided in the ID block 2. The cooling unit CP and the inspection unit LSCM2 are disposed at least either of two positions indicated by the arrows ARR1, ARR2 in FIG. 5. In addition, the cooling unit CP and the inspection unit LSCM are provided for each level of the two treatment layers A1, A2 in FIG. 3, for example. The inspection unit LSCM inspects the coating film (e.g., photoresist film) using a CCD camera or an image sensor. For example, in each of treating blocks 3, 5, a substrate W subjected to a coating treatment and a post-coating baking treatment by the heating/cooling unit PHP may be transported to the inspection unit LSCM and the cooling unit CP in the ID block 2. Then, the substrate W may be returned to the carrier C after inspection.

(5) In the fourth and fifth embodiments described above, the first treating block 3 includes the three treatment layers A1 to A3, and the second treating block 5 includes the two treatment layers B1, B2. In this regard, the numbers of the treatment layers of the two treating blocks 3, 5 may be set to other numbers. However, the number of the treatment layers of the first treating block 3 should not be the same as the number of the treatment layers of the second treating block 5 as in the first embodiment.

(6) In the embodiments and the modifications described above, the substrate platform 31 is formed in an X-shape as shown in FIG. 21A. The substrate platform 31 may be in another shape. For example, the substrate platform 31 may be a rectangular or a square.

(7) In the embodiments and the modifications described above, one substrate buffer BF is disposed in the middle of the first treating block 3 and the second treating block 5 as shown in FIGS. 3 and 4. Two substrate buffers BF1, BF2 arranged in the X-direction may be provided as necessary as shown in FIG. 17.

(8) In the embodiments and the modifications described above, the ID block 2 includes the two substrate transport mechanisms MHU1, MHU2. In this regard, the ID block 2 may include either of the two substrate transport mechanisms MHU1, MHU2.

(9) In the embodiments and the modifications described above, in order to process a carrier C transported by the operator, a lifting mechanism 98 for delivering to the carrier transport mechanism 61 (or the carrier buffer device 8) may be provided as shown in FIGS. 3 and 23. The lifting mechanism 98 is provided on the side of the second treating block 5, for example. The lifting mechanism 98 is disposed on the opposite side of the ID block 2 across the second treating block 5. The lifting mechanism 98 includes a platform 98A and an electric motor for moving the platform 98A upward/downward. The platform 98A is supported by the lifting mechanism 98 rotatably about a horizontal axis in the Y direction. Therefore, the platform 98A can be folded so that a placing surface to place a carrier C is parallel to the side surface where the lifting mechanism 98 is provided.

(10) In the embodiments and the modifications described above, the ID block 2 is provided with the four openers 11 to 14. However, the number of the openers is not limited to four. For example, only two openers 11, 13 may be provided in the ID block 2. In this instance, the opener 11 is used to take out the substrate W, and the opener 13 is used to accommodate the substrate W.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate, comprising:
   an indexer block where a carrier platform for placing a carrier capable of accommodating substrates is provided;
   a first treating block; and
   a second treating block, wherein
   the first treating block, the indexer block, and the second treating block are linearly connected in this order in a horizontal direction,
   the indexer block includes a substrate buffer disposed in the middle of the first treating block and the second treating block and configured to place a plurality of substrates,
   the substrate buffer includes a plurality of substrate platforms arranged vertically so as to overlap one another in plan view,
   the plurality of substrate platforms is each configured to place the substrate thereon,
   the first treating block includes a first transport mechanism having a first hand for holding a substrate and being movable for transporting the substrate,
   the second treating block includes a second transport mechanism having a second hand for holding a substrate and being movable for transporting the substrate,
   the first transport mechanism is configured such that the first hand can access the substrate buffer,
   the second transport mechanism is also configured such that the second hand can access the substrate buffer,
   the indexer block takes a substrate from a carrier placed on the carrier platform, and transports the substrate to the substrate buffer,
   the first treating block receives the substrate from the substrate buffer, performs a first treatment on the received substrate, and transports the substrate, subjected to the first treatment, to the substrate buffer,
   the second treating block receives the substrate from the substrate buffer, performs a second treatment on the received substrate, and transports the substrate, subjected to the second treatment, to the substrate buffer, and
   the indexer block returns the substrate, transported from at least either the first treating block or the second treating block, from the substrate buffer to the carrier placed on the carrier platform.

2. The substrate treating apparatus according to claim 1, wherein
   the carrier platform is disposed on either an upper face of or above each of the first treating block and the second treating block.

3. The substrate treating apparatus according to claim 1, further comprising:
   a carrier storage shelf mounted on at least one of the indexer block, the first treating block, and the second treating block, and configured to store the carrier; and
   a carrier transport mechanism mounted on at least one of the indexer block, the first treating block, and the second treating block, and configured to transport the carrier between the carrier platform and the carrier storage shelf, and
   the carrier transport mechanism is movable for transporting the carrier, and includes a movable gripper configured to grip the carrier.

4. The substrate treating apparatus according to claim 1, wherein
   the second treating block performs a treatment equal to a treatment by the first treating block.

5. The substrate treating apparatus according to claim 1, wherein
   the indexer block further includes inside thereof an indexer substrate transport mechanism having an indexer hand for holding a substrate and being movable for transporting the substrate, and
   the indexer substrate transport mechanism transports a substrate between a carrier placed on the carrier platform and the substrate buffer.

6. The substrate treating apparatus according to claim 5, wherein
   the indexer block includes another indexer substrate transport mechanism therein in addition to the indexer substrate transport mechanism, and
   the two indexer substrate transport mechanisms are arranged across the substrate buffer perpendicularly with respect to a direction in which the first treating block and the second treating block are arranged.

7. The substrate treating apparatus according to claim 1, wherein
   the first treating block receives a substrate from the substrate buffer via the first transport mechanism, performs a first treatment on the received substrate, and transports the substrate, subjected to the first treatment, to the substrate buffer via the first transport mechanism, and
   the second treating block receives the substrate from the substrate buffer via the second transport mechanism, performs a second treatment on the received substrate, and transports the substrate, subjected to the second treatment, to the substrate buffer via the second transport mechanism.

8. The substrate treating apparatus according to claim 1, wherein
   at least either the first treating block or the second treating block includes a plurality of treatment layers arranged to be stacked,
   the substrate buffer includes a plurality of buffer units provided respectively corresponding to levels of the treatment layers, and each of the buffer units is configured to be detachable and attachable from and to the indexer block.

9. A substrate treating apparatus for treating a substrate, comprising:
an indexer block where a carrier platform for placing a carrier capable of accommodating substrates is provided;
a first treating block; and
a second treating block, wherein
the first treating block, the indexer block, and the second treating block are linearly connected in this order in a horizontal direction,
the indexer block includes a substrate buffer disposed in the middle of the first treating block and the second treating block and configured to place a plurality of substrates,
the indexer block takes a substrate from a carrier placed on the carrier platform, and transports the substrate to the substrate buffer,
the first treating block receives the substrate from the substrate buffer, performs a first treatment on the received substrate, and transports the substrate, subjected to the first treatment, to the substrate buffer,
the second treating block receives the substrate from the substrate buffer, performs a second treatment on the received substrate, and transports the substrate, subjected to the second treatment, to the substrate buffer, and
the indexer block returns the substrate, transported from at least either the first treating block or the second treating block, from the substrate buffer to the carrier placed on the carrier platform,
the substrate treating apparatus further comprising:
a carrier storage shelf configured to store the carrier; and
a carrier transport mechanism configured to transport the carrier between the carrier platform and the carrier storage shelf, wherein
the carrier transport mechanism is movable for transporting the carrier, and includes a movable gripper configured to grip the carrier, and
the carrier storage shelf and a guide rail of the carrier transport mechanism are mounted on an upper face of a one of the first treating block and the second treating block whose level is lower.

10. A substrate treating for treating a substrate, comprising:
an indexer block where a carrier platform for placing a carrier capable of accommodating substrate is provided;
a first treating block; and
a second treating block, wherein
the first treating block, the indexer block, and the second treating block are linearly connected in this order in a horizontal direction,
the indexer block includes a substrate buffer disposed in the middle of the first treating block and the second treating block and configured to place a plurality of substrates,
the indexer block takes a substrate from a carrier placed on the carrier platform, and transports the substrate to the substrate buffer,
the first treating block receives the substrate from the substrate buffer, performs a first treatment on the received substrate, and transports the substrate, subjected to the first treatment, to the substrate buffer,
the second treating block receives the substrate from the substrate buffer, performs a second treatment on the received substrate, and transports the substrate, subjected to the second treatment, to the substrate buffer, and
the indexer block returns the substrate, transported from at least either the first treating block or the second treating block, from the substrate buffer to the carrier placed on the carrier platform,
the substrate buffer includes a plurality of substrate platforms arranged vertically,
each of the substrate platforms includes three support pins disposed about a vertical axis and supporting one substrate,
the three support pins are configured to be detachable and attachable from and to each of the substrate platforms, and
the three support pins of each of the substrate platforms are arranged so as not to overlap the three support pins of the substrate platforms immediately above and below in plan view.

11. A substrate transporting method for a substrate treating apparatus, the substrate treating apparatus including:
an indexer block where a carrier platform for placing a carrier capable of accommodating substrates is provided;
a first treating block; and
a second treating block,
the substrate transporting method comprising:
a first taking and transporting step of causing the indexer block to take a substrate from a carrier placed on the carrier platform and to transport the substrate to a substrate buffer provided inside the indexer block;
a first treating and transporting step of causing the first treating block to receive the substrate from the substrate buffer via a first transport mechanism, to perform a first treatment on the received substrate, and to transport the substrate, subjected to the first treatment, to the substrate buffer via the first transport mechanism;
a second treating and transporting step of causing the second treating block to receive the substrate from the substrate buffer via a second transport mechanism, to perform a second treatment on the received substrate, and to transport the substrate, subjected to the second treatment, to the substrate buffer via the second first transport mechanism; and
a returning step of causing the indexer block to return the substrate, transported from at least either the first treating block or the second treating block, from the substrate buffer to the carrier placed on the carrier platform, wherein
the first treating block, the indexer block, and the second treating block are linearly connected in this order in a horizontal direction, and
the substrate buffer is disposed in the middle of the first treating block and the second treating block, and places a plurality of substrates therein,
the substrate buffer includes a plurality of substrate platforms arranged vertically so as to overlap one another in plan view,
the plurality of substrate platforms is each configured to place the substrate thereon,
the first treating block includes the first transport mechanism having a first hand for holding a substrate and being movable for transporting the substrate,
the second treating block includes the second transport mechanism having a second hand for holding a substrate and being movable for transporting the substrate, the first transport mechanism is configured such that the first hand can access the substrate buffer, and the second transport mechanism is also configured such that the second hand can access the substrate buffer.

* * * * *